(12) United States Patent
Oh

(10) Patent No.: US 9,306,022 B1
(45) Date of Patent: Apr. 5, 2016

(54) SEMICONDUCTOR DEVICE HAVING DUAL WORK FUNCTION GATE STRUCTURE AND ELECTRONIC DEVICE HAVING THE SAME

(71) Applicant: SK hynix Inc., Gyeonggi-do (KR)

(72) Inventor: Tae-Kyung Oh, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/739,732

(22) Filed: Jun. 15, 2015

(30) Foreign Application Priority Data

Dec. 16, 2014 (KR) ........................ 10-2014-0181543

(51) Int. Cl.
| | | |
|---|---|---|
| H01L 29/00 | (2006.01) | |
| H01L 29/49 | (2006.01) | |
| H01L 29/78 | (2006.01) | |
| H01L 29/423 | (2006.01) | |

(52) U.S. Cl.
CPC ........ *H01L 29/4941* (2013.01); *H01L 29/4236* (2013.01); *H01L 29/4238* (2013.01); *H01L 29/7827* (2013.01)

(58) Field of Classification Search
CPC ............ H01L 29/4941; H01L 29/7827; H01L 29/4236; H01L 29/4238; H01L 29/4966; H01L 29/4958
See application file for complete search history.

(56) References Cited

U.S. PATENT DOCUMENTS

| | | | |
|---|---|---|---|
| 7,670,911 B2 | 3/2010 | Oyu | |
| 8,283,229 B2 | 10/2012 | Kim et al. | |
| 8,637,927 B2* | 1/2014 | Hwang | ............. H01L 27/10876 257/334 |
| 2007/0059502 A1* | 3/2007 | Wang | .................... C23C 14/046 428/209 |
| 2012/0043614 A1* | 2/2012 | Choi | ................... H01L 27/0629 257/369 |
| 2012/0168859 A1* | 7/2012 | Jin | ........................ H01L 29/407 257/330 |
| 2013/0095623 A1 | 4/2013 | Guo et al. | |
| 2013/0256805 A1* | 10/2013 | Chuang | ........... H01L 21/823842 257/369 |
| 2014/0015027 A1 | 1/2014 | Mikasa | |
| 2014/0159145 A1* | 6/2014 | Park | .................. H01L 29/66621 257/330 |
| 2014/0179073 A1 | 6/2014 | Kim | |

* cited by examiner

*Primary Examiner* — Nikolay Yushin
(74) *Attorney, Agent, or Firm* — IP & T Group LLP

(57) ABSTRACT

A semiconductor device includes a body including a first junction region; a pillar positioned over the body, and including a vertical channel region and a second junction region over the vertical channel region; a gate trench exposing side surfaces of the pillar; a gate dielectric layer covering the gate trench; and a gate electrode embedded in the gate trench, with the gate dielectric layer interposed therebetween. The gate electrode includes a first work function liner overlapping with the vertical channel region, and including an aluminum-containing metal nitride; a second work function liner overlapping with the second junction region, and including a silicon-containing non-metal material; and an air gap positioned between the second work function liner and the second junction region.

20 Claims, 27 Drawing Sheets

SEMICONDUCTOR DEVICE HAVING DUAL WORK FUNCTION GATE STRUCTURE AND ELECTRONIC DEVICE HAVING THE SAME

CROSS-REFERENCE TO RELATED APPLICATION

This application claims priority under 35 U.S.C. §119 to Korean Patent Application No. 10-2014-0181543 filed on Dec. 16, 2014, the disclosure of which is herein incorporated by reference in its entirety.

BACKGROUND

1. Technical Field

Exemplary embodiments of the present invention relate to a semiconductor device, and more particularly, to a semiconductor device having a dual work function gate structure, a method for fabricating the same, a memory cell having the same, and an electronic device having the same.

2. Related Art

As a semiconductor device is highly integrated, a gate-induced drain leakage (GIDL) characteristic in a non-planar transistor exerts a substantial influence on the performance of the semiconductor device.

SUMMARY

Various embodiments are directed to a semiconductor device capable of improving gate-induced drain leakage (GIDL) current and current drivability, and a method for fabricating the same.

Also, various embodiments are directed to a memory cell capable of improving a refresh characteristic.

Further, various embodiments are directed to an electronic device with improved performance.

In an embodiment, a semiconductor device may include: a body including a body including a first junction region; a pillar positioned over the body and including a vertical channel region and a second junction region over the vertical channel region; a gate trench exposing side surfaces of the pillar; a gate dielectric layer provided in the gate trench and over a side surface of the pillar; and a gate electrode provided in the gate trench, wherein the gate dielectric layer is interposed between the gate electrode and the gate trench, wherein the gate electrode comprising: a first work function liner over the vertical channel region and including an aluminum-containing metal nitride; a second work function liner over the second junction region and including a silicon-containing non-metal material; and an air gap positioned between the second work function liner and the second junction region. The semiconductor device may further comprise: a bit line trench formed in the body; a bit line provided in the bit line trench and electrically coupled to the first junction region; a bit line capping layer covering a top surface and side surfaces of the bit line; and a memory element electrically coupled to the second junction region. The first work function liner may include a material which has a work function higher than the second work function liner. The first work function liner may include titanium aluminum nitride (TiAlN), and the second work function liner may include an N-type impurity-doped polysilicon. The gate electrode may further comprise a first low resistivity electrode provided over the first work function liner; and a second low resistivity electrode over the second work function liner. The second low resistivity electrode may include a material which is non-reactive with the second work function liner. The first low resistivity electrode may include a fluorine-free material which is non-reactive with the second work function liner. The gate electrode may comprise: a main part; and a pair of first and second branch parts from the main part, the main part extends in a first direction, wherein each of the pair of first and second branch parts extends in a second direction different from the first direction, and the main part, the first branch part, and the second branch part are formed over first, second, and third side surface of the pillar, respectively. The gate electrode may further comprise: a first low resistivity electrode covering a side surface of the first work function liner; a second low resistivity electrode covering a side surface of the second work function liner; and an upper barrier positioned between the second work function liner and the second low resistivity electrode. The first low resistivity electrode may include a material which is non-reactive with the second work function liner, and the second low resistivity electrode may include a material which is reactive with the second work function liner. The gate electrode may further comprise: a first low resistivity electrode covering a side surface of the first work function liner; a lower barrier positioned between the first work function liner and the first low resistivity electrode; a second low resistivity electrode covering a side surface of the second work function liner; and an upper barrier positioned between the second work function liner and the second low resistivity electrode. The first low resistivity electrode and the second low resistivity electrode include materials which are reactive with the second work function liner.

In an embodiment, a semiconductor device may include: a body including a first junction region; a bit line trench formed in the body; a bit line provided in the bit line trench and electrically coupled to the first junction region; a bit line capping layer provided over a top surface and over side surfaces of the bit line; a pair of first and second pillars positioned over the body and including vertical channel regions and second junction regions over the vertical channel regions; a gate trench having main trench which expose a space between the first pillar and the second pillar, and branch trenches which expose side surfaces of the first and second pillars; a pair of first and second gate electrodes provided over one side surface of the first and second pillars the in the gate trench; and memory elements electrically coupled with the second junction regions, respectively, wherein each of the first and second gate electrodes comprising: a first work function liner over a side surface of the vertical channel region and including an aluminum-containing metal nitride; a second work function liner over a side surface of the second junction region and including a silicon-containing non-metal material; and an air gap positioned between the second work function liner and the second junction region. Each of the first and second gate electrodes may comprise: a main part positioned between the first pillar and the second pillar; and a pair of first and second branch parts extending from the main part, the main part extends in a first direction, wherein each of the pair of first and second branch parts extends in a second direction different from the first direction, the main part, the first branch part, and the second branch part are formed over the side surfaces of each of the first and second pillars. The side surfaces may comprise: a first side surface over the main part; a second side surface over the first branch part; and a third side surface over the second branch part. Each of the first and second pillars may further comprise: a fourth side surface; and an isolation layer contacting the fourth side surface. The first work function liner may include titanium aluminum nitride (TiAlN), and the second work function liner may include an N-type impurity-doped polysilicon. Each of the first and second gate electrodes may further comprise: a first low resistivity electrode over the first work function liner; and a second low resistivity electrode over the second work function liner. Each of the first and second gate electrodes may further comprise: a first low resistivity electrode over the first work function liner; a second low resistivity electrode over the second work function liner; and an upper barrier positioned between the second work function liner and the second low resistivity electrode. Each of the first and second gate electrodes may further comprise: a first low resistivity electrode over the first work function liner; a lower barrier positioned between the first work function liner and the first low resistivity electrode; a second low resistivity electrode over the second work function liner; and an upper barrier positioned between the second work function liner and the second low resistivity electrode.

In an embodiment, a method for fabricating a semiconductor device may include: forming a pillar; forming a gate dielectric layer over a lower side surface and over an upper side surface of the pillar; forming a gate electrode including a first work function liner over the lower side surface of the pillar; forming a second work function liner over the upper side surface of the pillar, forming a gap between the second work function liner and the upper side surface of the pillar; capping the gap to form an air gap; and forming a junction region in the pillar to have a depth that overlaps with the air gap and the second work function liner, The air gap is provided between the junction region and the second work function liner. The forming of the pillar may comprise: preparing a substrate; etching the substrate to form a line type active region; patterning the line type active region to form an island type active region; etching the island type active region to form a preliminary pillar; and etching the preliminary pillar to form the pillar. The forming of the gate electrode may comprise: forming a preliminary first work function liner over the lower side surface and the upper side surface of the pillar; forming the second work function liner over the preliminary first work function liner; and recessing the preliminary first work function liner to form the first work function liner, The first work function liner does not extend over the second work function liner. The first work function liner may include titanium aluminum nitride. The second work function liner may include an N-type impurity-doped polysilicon. The forming of the gate electrode may comprise: forming a first work function liner layer over the gate dielectric layer; etching the first work function liner layer to form a preliminary first work function liner which is positioned on the lower side surface of the pillar; forming a first low resistivity electrode over the preliminary first work function liner and at a level lower than a top surface of the pillar; forming a second work function liner layer at a level higher than the first low resistivity electrode and the preliminary first work function liner; forming a second low resistivity layer over the second work function liner layer; recessing the second low resistivity layer and the second work function liner layer to form a second low resistivity electrode and the second work function liner at a level lower than the top surface of the pillar; and recessing the preliminary first work function liner to non-overlap with the first work function liner, and forming the first work function liner and the gap. The second low resistivity electrode is formed of a material which is non-reactive with the second work function liner, the first low resistivity electrode is formed of a fluorine-free material, the first low resistivity electrode is formed of a material which is non-reactive with the second work function liner. The first low resistivity electrode is formed of a material which is non-reactive with the second work function liner, and the second low resistivity electrode is formed of a material which is reactive with the second work function liner. The method may further comprise: forming an upper barrier which is positioned between the second work function liner and the second low resistivity electrode. The method may further comprise: forming a lower barrier which is positioned between the first work function liner and the first low resistivity electrode; and forming an upper barrier which is positioned between the second work function liner and the second low resistivity electrode. The forming of the pillar may comprise: preparing a substrate; etching the substrate to form a line type active region; patterning the line type active region to form an island type active region; etching the island type active region to form a bit line trench and a preliminary pillar; etching the preliminary pillar to form a gate trench which crosses the bit line trench and the pillar, The pillar has first, second, and third side surfaces and the gate trench expose the first side surface; and forming a first branch trench and a second branch trench which expose the second and third side surfaces of the pillar by extending the gate trench. The gate electrode may comprise a first branch part which is positioned in the first branch trench and a second branch part which is positioned in the second branch trench.

In an embodiment, a method for fabricating a semiconductor device may include: preparing a substrate which may include a first junction region; etching the substrate to form a first pillar and a second pillar which are separated from each other in a gate trench; forming, in a gate trench, a preliminary gate electrode including (i) preliminary first work function liners over lower side surfaces and upper side surfaces of the first and second pillars, and (ii) second work function liners over the upper side surfaces of the first and second pillars; separating the preliminary gate electrode, and forming a first gate electrode which overlaps with the upper and lower side surfaces of the first pillar and a second gate electrode which overlaps with the upper and lower side of the second pillar; recessing the preliminary first work function liners to non-overlap with the second work function liners, and forming gaps; capping the gaps, and forming air gaps; and forming second junction regions in the first and second pillars to have a depth that overlaps with the air gaps, wherein each of the first and second pillars has first, second, and third side surfaces and the gate trench expose the first side surface of the first and second pillars.

In an embodiment, a memory cell may include a body including a bit line trench; a pillar including a first junction region which is formed in the body over a bottom surface of the bit line trench, a buried bit line which is electrically coupled with the first junction region and is embedded in the bit line trench, a vertical channel region which is positioned over the body, and a second junction region over the vertical channel region; a gate trench exposing side surfaces of the pillar; a gate dielectric layer covering the gate trench; and a buried word line embedded in the gate trench, with the gate dielectric layer interposed therebetween, the buried word line including: a high work function liner overlapping with the vertical channel region and including titanium aluminum nitride; a low work function liner overlapping with the second junction region and including an N-type doped polysilicon; and an air gap positioned between the low work function liner and the second junction region.

In an embodiment, an electronic device may include a plurality of semiconductor devices, at least any one semiconductor device of the plurality of semiconductor devices including a body which includes a first junction region; a pillar which is positioned over the body and includes a vertical channel region and a second junction region over the vertical channel region; a gate trench which exposes side surfaces of the pillar; a gate dielectric layer which covers the gate trench; and a gate electrode which is embedded in the gate trench, with the gate dielectric layer interposed therebetween, the gate electrode including: a high work function liner overlapping with the vertical channel region and including titanium aluminum nitride; a low work function liner overlapping with the second junction region and including an N-type doped polysilicon; and an air gap positioned between the low work function liner and the high work function liner.

DETAILED DESCRIPTION

Figure 1:
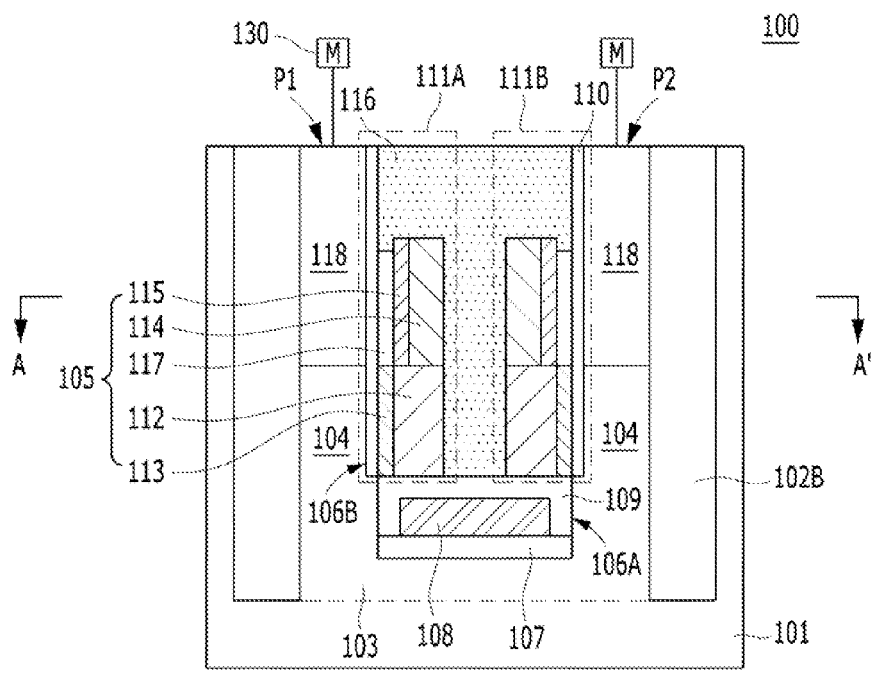
FIG. 1 is a cross-sectional view illustrating a semiconductor device in accordance with a first embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2:
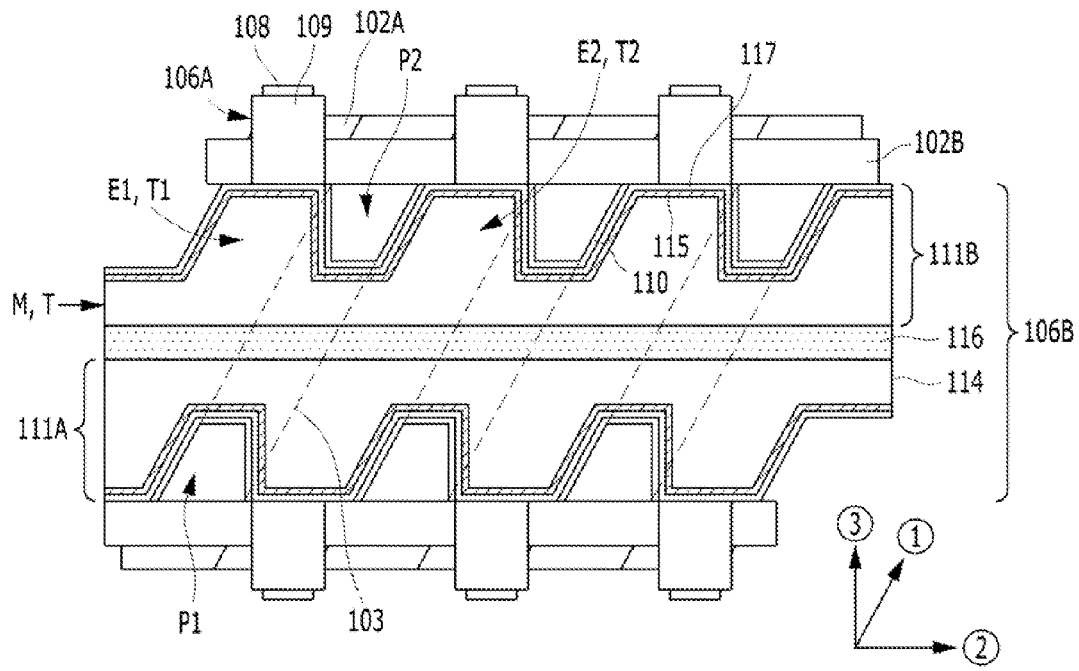
FIG. 2 is a plan view taken along the line A-A' of FIG. 1.

FIG. 1 is a cross-sectional view illustrating a semiconductor device in accordance with a first embodiment. FIG. 2 is a plan view taken along the line A-A' of FIG. 1. The semiconductor device in accordance with the first embodiment may include a memory cell.

A semiconductor device 100 may include a substrate 101. The substrate 101 may include a semiconductor substrate. The substrate 101 may be formed of a silicon-containing material. The substrate 101 may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. In another embodiment, the substrate 101 may include semiconductor material such as germanium. Also, the substrate 101 may include III/V group semiconductor materials, for example, a compound semiconductor substrate such as GaAs. Further, the substrate 101 may include a silicon-on-insulator (SOI) substrate.

Isolation layers and active regions may be formed in the substrate 101. The isolation layers may include a first isolation layer 102A and a second isolation layer 102B. The active regions may be defined by the first isolation layer 102A and the second isolation layer 102B. The first isolation layer 102A may extend in a first direction ①, and the second isolation layer 102B may extend in a second direction ② crossing with the first direction ①. The first isolation layer 102A may become discontinuous by the second isolation layer 102B. The first isolation layer 102A and the second isolation layer 102B may be STI (shallow trench isolation) regions which are formed by trench etching. The first isolation layer 102A and the second isolation layer 102B may be formed by filling a dielectric material in isolation trenches (not numbered). The first isolation layer 102A and the second isolation layer 102B may be formed of the same material or different materials. For example, each of the first isolation layer 102A and the second isolation layer 102B may include silicon oxide, silicon nitride or a combination thereof.

The active regions may be an island type. A plurality of active regions may be arrayed in the second direction and the first isolation layer 102A is interposed therebetween. The plurality of active regions may be spaced from each other with a uniform interval and may have the same size as each other. Each active region may have a major axis and a minor axis. The second isolation layer 102B may be positioned between the major axes of the active regions. The first isolation layer 102A may be positioned between the minor axes of the active regions. Hereinbelow, descriptions will be made for one active region. The active region may include a body 103, and a first pillar P1 and a second pillar P2 which are positioned on the body 103. The first pillar P1 and the second pillar P2 may form a pair and be symmetrical to each other. One side surface of each of the first pillar P1 and the second pillar P2 may contact the second isolation layer 102B.

The substrate 101 may include trenches. The trenches may include a bit line trench 106A and a gate trench 106B over the bit line trench 106A. The bit line trench 106A may extend in a third direction ③. The third direction ③ may be a direction crossing with the first direction ① and the second direction ②. The gate trench 106B may extend in the second direction ②. The second direction may be a direction crossing with the first direction ① and the third direction ③.

The bit line trench 106A may be embedded in the body 103. The first pillar P1 and the second pillar P2 may be separated from each other by the gate trench 106B. A bit line 108 may be embedded in the bit line trench 106A. A bit line capping layer 109 may be formed on the bit line 108. The bit line 108 may include a low resistivity metal. The bit line 108 may include tungsten. The bit line capping layer 109 may include a dielectric material. The bit line capping layer 109 may include silicon oxide, silicon nitride or a combination thereof. The bit line capping layer 109 may cover the side surfaces and the top surface of the bit line 108. In this structure, the bit line 108 may be referred to as a buried bit line.

The gate trench 106B may be a separating space between the first pillar P1 and the second pillar P2. A pair of gate structures 111A and 111B may be embedded in the gate trench 106B. Between the pair of gate structures 111A and 111B, the first gate structure 111A may overlap with the side surfaces of the first pillar P1, and the second gate structure 111B may overlap with the side surfaces of the second pillar P2.

The first gate structure 111A and the second gate structure 111B may be symmetrical to each other. Each of the first gate structure 111A and the second gate structure 111B may include a gate dielectric layer 110, a gate electrode 105, a gate capping layer 116, and an air gap 117. The gate capping layer 116 of the first gate structure 111A and the gate capping layer 116 of the second gate structure 111B may be integrated with each other to form a single body. That is, the gate capping layer 116 may fill a space between the first gate structure 111A and the second gate structure 111B. The top surfaces of the gate electrodes 105 may be positioned at a level lower than the top surfaces of the first pillar P1 and the second pillar P. The top surface of the gate capping layer 116 may be the same level as the top surfaces of the first pillar P1 and the second pillar P2. Since each gate electrode 105 is positioned in the gate trench 106B and is covered by the gate capping layer 116, the gate electrode 105 may have a buried structure. This may be referred to as a buried gate electrode. The semiconductor device 100 may be applied to a memory cell. Therefore, the first and second gate structures 111A and 111B may become a buried word line.

The gate dielectric layer 110 may be formed on the sidewalls of the gate trench 106B. That is, the gate dielectric layer 110 may cover the gate trench 106B. Also, the gate dielectric layer 110 may cover the lower side surfaces and the upper side surfaces of the first pillar P1 and the second pillar P. The gate dielectric layer 110 may include silicon oxide, silicon nitride, silicon oxynitride, a high-k material or a combination thereof. The high-k material may include a material which has a dielectric constant higher than the dielectric constant of silicon oxide. For example, the high-k material may include a material which has a dielectric constant higher than 3.9. For another example, the high-k material may include a material which has a dielectric constant higher than 10. Yet in another example, the high-k material may include a material which has a dielectric constant of 10 to 30. The high-k material may include at least one metallic element. The high-k material may include a hafnium-containing material. The hafnium-containing material may include hafnium oxide, hafnium silicon oxide, hafnium silicon oxynitride or a combination thereof. In another embodiment, the high-k material may include lanthanum oxide, lanthanum aluminum oxide, zirconium oxide, zirconium silicon oxide, zirconium silicon oxynitride, aluminum oxide or a combination thereof. In another embodiment, other high-k materials known in the art may be used.

The bottom surface of the gate electrode 105 may contact the bit line capping layer 109. That is, the bit line capping layer 109 may be positioned between the gate electrode 105 and the bit line 108. The gate electrode 105 of the first gate structure 111A may overlap with the side surfaces of the first pillar P1. The gate electrode 105 of the second gate structure 111B may overlap with the side surfaces of the second pillar P2.

The gate electrode 105 may include a first work function liner 113 and a second work function liner 115. The first work function liner 113 may be formed between the lower side surfaces of each of the first pillar P1 and the second pillar P2 and the gate dielectric layer 110. The second work function liner 115 may be formed between the upper side surfaces of each of the first pillar P1 and the second pillar P2 and the gate dielectric layer 110. The lower side surfaces of each of the first pillar P1 and the second pillar P2 may correspond to a vertical channel region 104. The upper side surfaces of each of the first pillar P1 and the second pillar P2 may correspond to a second junction region 118.

The junction regions 118 respectively overlapping with the second work function liner 115 may be formed in the first and second pillars P1 and P2, respectively. A first junction region 107 may be formed in the body 103. The first junction region 107 may be electrically coupled to the bit line 108. The first junction region 107 may be positioned at a level lower than the second junction region 118. The vertical channel region 104 which is vertically positioned may be formed between the first junction region 107 and the second junction region 118. The vertical channel region 104 may be disposed at a level higher than the first junction region 107, and the second junction region 118 may be disposed at a level higher than the vertical channel region 104. Each second junction region 118 may be electrically coupled with a memory element 130. Each of the first and second pillars P1 and P2 may have a structure which includes the vertical channel region 104 and the second junction region 118 vertically positioned on the vertical channel region 104. The first junction region 107 and the second junction region 118 may be doped with a conductivity type impurity. For example, the conductivity type impurity may include phosphorus (P), arsenic (As), antimony (Sb) or boron (B). The first junction region 107 and the second junction region 118 may be doped with the same conductivity type impurity. The first junction region 107 and the second junction region 118 may respectively correspond to a source region and a drain region. The second junction region 118 may not overlap with the first work function liner 113. The first work function liner 113 may overlap with the vertical channel region 104. The first work function liner 113 may not overlap with the first junction region 107.

The air gap 117 may be positioned between the second work function liner 115 and the second junction region 118. Namely, the air gap 117 may overlap with the second junction region 118. The first work function liner 113 may be positioned under the air gap 117. The first work function liner 113 and the second work function liner 115 may not overlap with each other.

The memory element 130 may be realized as a variety of types. The memory element 130 may be a capacitor. Accordingly, the memory element 130 may include a storage node which is electrically coupled with the second junction region 118. The storage node may be a cylinder type or a pillar type. A capacitor dielectric layer may be formed on the surface of the storage node. The capacitor dielectric layer may include zirconium oxide, aluminum oxide, hafnium oxide, etc. For example, the capacitor dielectric layer may have a ZAZ structure in which first zirconium oxide, aluminum oxide and second zirconium oxide are stacked. A plate node is formed on the capacitor dielectric layer. The storage node and the plate node ray include a metal-containing material.

In another embodiment, the memory element 130 may include a variable resistor. The variable resistor may include a phase change material. The phase change material may include chalcogenide material such as tellurium (Te) and selenium (Se). In another embodiment, the variable resistor may include a transition metal oxide. In still another embodiment, the variable resistor may be a magnetic tunnel junction (MTJ).

Referring to FIG. 2, each of the first and second gate structures 111A and 111B may include a main part M, a first branch part E1, and a second branch part E2. The main part M may be parallel to the gate trench 106B, and the first branch part E1 and the second branch part E2 may be branched from the main part M. The main part M, the first branch part E1 and the second branch part E2 may be a type which covers at least three side surfaces of each of the first and second pillars P1 and P2. In the first gate structure 111A the main part M may extend in a direction crossing with the bit line 108, and each of the first branch part E1 and the second branch part E2 may be positioned between adjacent first pillars P1. In the same manner as the first gate structure 111A, in the second gate structure 111B, the main part M may extend in a direction crossing with the bit line 108, and each of the first branch part E1 and the second branch part E2 may be positioned between adjacent second pillars P2.

The gate trench 106B may be a line type which extends in any one direction. The gate trench 106B may include main trenches T, first branch trenches T1, and second branch trenches T2. The gate trench 106B may have the same structure as the first and second gate structures 111A and 111B. For example, the main parts M of the first and second gate structures 111A and 111B may be positioned in the main trenches T, the first branch parts E1 of the first and second gate structures 111A and 111B may be positioned in the first branch trenches T1, and the second branch parts E2 of the first and second gate structures 111A and 111B may be positioned in the second branch trenches T2. The main trenches T may extend in a direction crossing with the bit line trench 106A, and the first and second branch trenches T1 and T2 may be positioned between adjacent first pillars P1 and between adjacent second pillars P2.

Hereafter, the gate electrode 105 will be described in detail.

The gate electrode 105 may include a low resistivity portion, a work function portion, and the air gap 117. The work function portion may include the first work function liner 113 and the second work function liner 115. The low resistivity portion may include a first low resistivity electrode 112 and a second low resistivity electrode 114. The first low resistivity electrode 112 may cover a side surface of the first work function liner 113. The second low resistivity electrode 114 may cover a side surface of the second work function liner 115. The air gap 117 may be positioned between the second work function liner 115 and the second junction region 118.

Hereinbelow, the first work function liner 113 and the first low resistivity electrode 112 will be collectively referred to as a lower buried portion. The second work function liner 115 and the second low resistivity electrode 114 will be collectively referred to as an upper buried portion.

The lower buried portion may include the first work function liner 113 and the first low resistivity electrode 112. The first low resistivity electrode 112 may overlap with the lower side surfaces of each of the first and second pillars P1 and P2. The first work function liner 113 may be positioned between the first low resistivity electrode 112 and the gate dielectric layer 110. The heights of the top surfaces of the first work function liner 113 and the first low resistivity electrode 112 may be the same. The first work function liner 113 may cover the lower side surfaces of each of the first and second pillars P1 and P2 and may not overlap with the first and second junction regions 107 and 118. For example the first work function liner 113 may overlap with the vertical channel region 104.

The upper buried portion may include the second work function liner 115 and the second low resistivity electrode 114. The second low resistivity electrode 114 may overlap with the upper side surfaces of each of the first and second pillars P1 and P2. The second work function liner 115 may be positioned between the second low resistivity electrode 114 and the gate dielectric layer 110. The second work function liner 115 may not extend between the first low resistivity electrode 112 and the second low resistivity electrode 114. The heights of the top surfaces of the second work function liner 115 and the second low resistivity electrode 114 may be the same. The second work function liner 115 covers the upper side surfaces of each of the first and second pillars P1 and P2 and may overlap with at least the second junction region 118.

The gate capping layer 116 may be formed on the upper buried portion. The gate capping layer 116 protects the gate electrode 105. The gate capping layer 116 may include a dielectric material. The gate capping layer 116 may include silicon nitride, silicon oxynitride or a combination thereof. In another embodiment, the gate capping layer 116 may include a combination of silicon nitride and silicon oxide.

The first work function liner 113 and the second work function liner 115 may be conductive materials. The first work function liner 113 and the second work function liner 115 are formed of different work function materials. The first work function liner 113 may have a work function higher than the second work function liner 115. The first work function liner 113 may include a high work function material. The second work function liner 115 may include a low work function material. The high work function material is a material which has a work function higher than silicon which has a mid-gap work function value. The low work function material is a material which has a work function lower than silicon having the mid-gap work function value. That is, the high work function material may have a work function higher than 4.5 eV, and the low work function material may have a work function lower than 4.5 eV. The first work function liner 113 may include a metal-containing material. The second work function liner 115 may include a non-metal material.

The first work function liner 113 may include a metal nitride, and the second work function liner 115 may include a silicon-containing material. The first work function liner 113 may contain a first work function adjustment species that has a high work function. The first work function adjustment species may include aluminum (Al). Accordingly, the first work function liner 113 may include a metal nitride which contains aluminum. The work function of a metal nitride which contains aluminum is higher than the work function of metal nitride which does not contain aluminum. In an embodiment, the first work function liner 113 may include aluminum-containing titanium nitride. The aluminum-containing titanium nitride may also be referred to as titanium aluminum nitride (TiAlN) or aluminum-doped titanium nitride (Al-doped TiN). The first work function liner 113 may protect the gate dielectric layer 110 from the first low resistivity electrode 112. For example, the first work function liner 113 may prevent the impurity contained in the first low resistivity electrode 112 from diffusing to the gate dielectric layer 110.

The second work function liner 115 has a low work function. The second work function liner 115 may contain a second work function adjustment species to have a low work function. The second work function adjustment species may include an N-type dopant. Accordingly, the second work function liner 115 may include a silicon-containing material which contains an N-type dopant. In an embodiment, the second work function liner 115 may include polysilicon or polysilicon doped with an N-type dopant, hereinafter, referred to as an N-type doped polysilicon. The N-type doped polysilicon has a low work function. The N-type dopant may include phosphorus (P) or arsenic (As). The second work function liner 115 may overlap with the second junction region 118. For example, the second work function liner 115 may overlap with the second junction region 118.

The first low resistivity electrode 112 includes a material which has a specific resistivity lower than the first work function liner 113. The second low resistivity electrode 114 includes a material which has a specific resistivity lower than the second work function liner 115. The first low resistivity electrode 112 and the second low resistivity electrode 114 may be formed of the same material or different materials. The first low resistivity electrode 112 and the second low resistivity electrode 114 may be formed of a low resistivity material. In this structure, the resistivity of the gate electrode 105 is decreased by the first low resistivity electrode 112 and the second low resistivity electrode 114. The first low resistivity electrode 112 and the second low resistivity electrode 114 include a low resistivity metal-containing material. To decrease the resistivity of the gate electrode 105, the second work function liner 115 may be formed to a thin thickness. In this structure, the resistivity of the gate electrode 105 may be significantly decreased by increasing the volume of a metal material.

In the first embodiment, the second low resistivity electrode 114 may be formed of a non-reactive material to the second work function liner 115. That is, the second low resistivity electrode 114 may be formed of a material which does not react with the second work function liner 115. For example, when titanium nitride is used as the second low resistivity electrode 114, the silicon of the second work function liner 115 and the second low resistivity electrode 114 do not react with each other. Therefore, a barrier may be omitted between the second low resistivity electrode 114 and the second work function liner 115.

Therefore, the second low resistivity electrode 114 may be formed of a low resistivity meta containing material which has a specific resistivity lower than the second work function liner 115 and is non-reactive with the second work function liner 115.

The first low resistivity electrode 112 may be formed of a low resistivity meta containing material which has a specific resistivity lower than the first and second work function liners 113 and 115 and is non-reactive with the second work function liner 115. Moreover, the first low resistivity electrode 112 may be formed of a material which does not attack the gate dielectric layer 110. For example, the first low resistivity electrode 112 may be formed of a material which does not contain an impurity such as fluorine.

The first low resistivity electrode 112 and the second low resistivity electrode 114 may include titanium nitride. Since the second low resistivity electrode 114 is a non-reactive material to the second work function liner 115 and the first low resistivity electrode 112 is a material which does not contain fluorine, the gate electrode 105 may not need a barrier and thus, be referred to as a barrier-free gate electrode.

The first junction region 107, the second junction region 118 and the first gate structure 111A may form a first transistor. The first junction region 107, the second junction region 118 and the second gate structure 111B may form a second transistor. Each of the first and second transistors may be referred to as a buried gate type transistor. The vertical channel region 104 may be defined along the surface of the gate trench 106B and between the first junction region 107 and the second junction region 118. In an embodiment, the vertical channel region 104 may be doped.

According to the first embodiment, a threshold voltage (Vt) is adjusted or shifted by the first work function liner 113. For example, the aluminum of the first work function liner 113 forms a dipole layer at the interface of the first work function liner 113 and the gate dielectric layer 110. The dipole layer may change the work function of the lower buried portion and accordingly may shift a threshold voltage. As a result, a channel dose may be decreased by the first work function liner 113. In this way, the first work function liner 113 may be a material which contains a dipole forming species.

Further, in the first embodiment, since the second work function liner 115 has a low work function, gate-induced drain leakage (GIDL) at the second junction region 118 may be suppressed. When the first work function liner 113 of a high work function overlaps with the second junction region 118, gate-induced drain leakage may increase. Therefore, the first work function liner 113 may be adjusted in height to not overlap with the second junction region 118. An N-type work function metal has a work function higher than the N-type doped polysilicon. When an N-type work function metal is used as the second work function liner 115, it is difficult to obtain a low work function corresponding to the N-type doped polysilicon. Thus, N-type doped polysilicon is preferable to N-type work function metal as the second work function liner 115.

While the specific resistivity of the second work function liner 115 may be relatively higher than other metal materials, an influence exerted on the resistivity of the gate electrode 105 may be minimized by decreasing the rate that is, the thickness of the second work function liner 115 in the gate electrode 105.

Gate-induced drain leakage (GIDL) may be further suppressed by the air gap 117. For example, even though the thickness of the gate dielectric layer 110 is thin, the air gap 117 and the second work function liner 115 formed between the second junction region 118 and the gate electrode 105 may further suppress gate-induced drain leakage (GIDL).

The gate electrode 105 may be a dual work function vertical gate electrode. For example, the dual work function vertical gate electrode includes the first work function liner 113 which has a high work function and the second work function liner 115 which has a low work function.

When the semiconductor device 100 is applied to a DRAM, a memory cell may include the gate structures 111A and 111B including the first work function liner 113 of a high work function and the second work function liner 115 of a low work function, that is, a buried word line. Accordingly, the refresh characteristic of the DRAM may be improved. Also, since a buried word line and a buried bit line are embedded in the substrate 101, the degree of integration may be improved.

Figure 3:
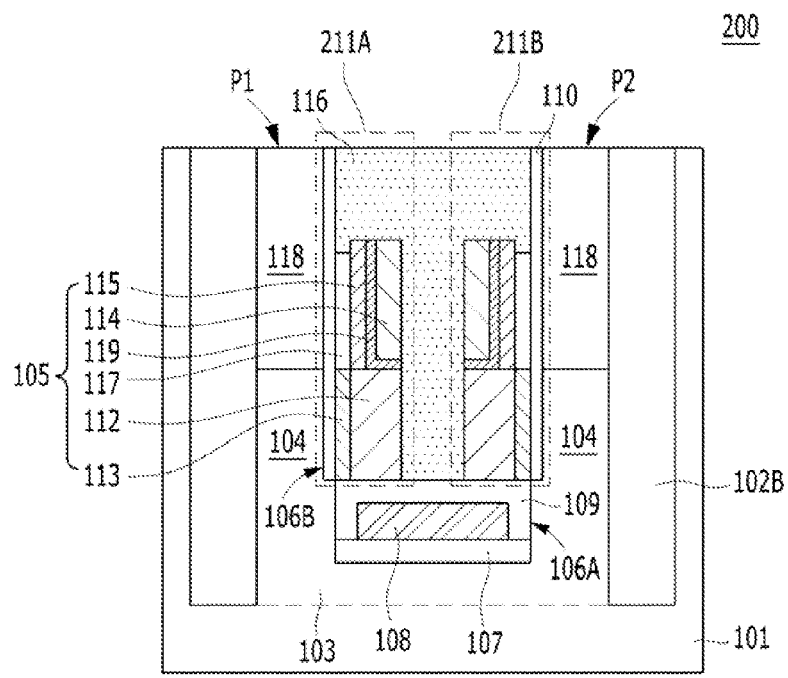
FIG. 3 is a cross-sectional view illustrating a semiconductor device in accordance with a second embodiment.

FIG. 3 is a cross-sectional view illustrating a semiconductor device in accordance with a second embodiment. Some components of a semiconductor device 200 in accordance with the second embodiment may be the same as those of the semiconductor device 100 in accordance with the first embodiment.

Referring to FIG. 3, each of first and second gate structures 211A and 211B of the semiconductor device 200 in accordance with the second embodiment may include a gate dielectric layer 110, a gate electrode 105, and a gate capping layer 116.

In the second embodiment, the gate electrode 105 may further include an upper barrier 119. A second low resistivity electrode 114 may be formed of a material which has a low resistivity and is reactive with a second work function liner 115. That is, the second low resistivity electrode 114 may be formed of a material which easily reacts with the second work function liner 115. For example, tungsten may be used as the second low resistivity electrode 114. A tungsten silicide may be formed as the silicon of the second work function liner 115 and the second low resistivity electrode 114 react with each other. A resistivity may increase by the tungsten silicide. Therefore, to prevent such silicide reaction, the upper barrier 119 may be positioned between the second low resistivity electrode 114 and the second work function liner 115. The upper barrier 119 may be formed of a material which has a specific resistivity lower than the second work function liner 115.

In this way, the second low resistivity electrode 114 may be formed of a low resistivity metal-containing material which has a specific resistivity lower than the second work function liner 115 and is reactive with the second work function liner 115.

A first low resistivity electrode 112 may be formed of a low resistivity metal-containing material which has a specific resistivity lower than first and second work function liners 113 and 115 and is non-reactive with the second work function liner 115. In addition, the first low resistivity electrode 112 may be formed of a material which does not attack the gate dielectric layer 110.

According to the second embodiment, a first work function liner 113 may include titanium aluminum nitride, and the second work function liner 115 may include N-type doped polysilicon. The first low resistivity electrode 112 may include titanium nitride. The second low resistivity electrode 114 may include tungsten. The upper barrier 119 may include titanium nitride.

Figure 4:
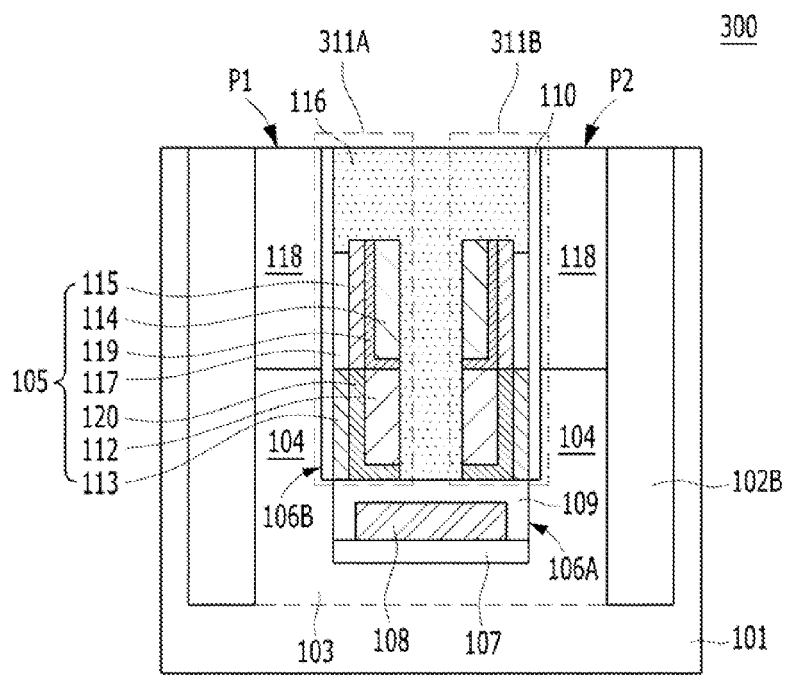
FIG. 4 is a cross-sectional view illustrating a semiconductor device in accordance with a third embodiment.

FIG. 4 is a cross-sectional view illustrating a semiconductor device in accordance with a third embodiment. Some components of a semiconductor device 300 in accordance with the third embodiment may be the same as those of the semiconductor device 100 in accordance with the first embodiment.

Referring to FIG. 4, each of first and second gate structures 311A and 311B of the semiconductor device 300 in accordance with the third embodiment may include a gate dielectric layer 110, a gate electrode 105, and a gate capping layer 116.

In the third embodiment, the gate electrode 105 may further include an upper barrier 119 and a lower barrier 120. The upper barrier 119 may be formed between a second work function liner 115 and a second low resistivity electrode 114. A portion of the upper barrier 119 may be positioned between a first low resistivity electrode 112 and the second low resistivity electrode 114. The lower barrier 120 may be positioned between a first work function liner 113 and the first low resistivity electrode 112.

The second low resistivity electrode 114 may be formed of a material which has a low resistivity and is reactive with the second work function liner 115. That is, the second low resistivity electrode 114 may be formed of a material which easily reacts with the second work function liner 115. For example, tungsten may be used as the second low resistivity electrode 114. A tungsten silicide may be formed as the silicon of the second work function liner 115 so that the second low resistivity electrode 114 react with each other. A resistivity may increase by the tungsten silicide. Therefore, to prevent such silicide reaction, the upper barrier 119 is positioned between the second low resistivity electrode 114 and the second work function liner 115. The upper barrier 119 may be formed of a material which has a specific resistivity lower than the second work function liner 115.

The second low resistivity electrode 114 may be formed of a low resistivity metal-containing material which has a specific resistivity lower than the second work function liner 115 and is reactive with the second work function liner 115.

The first low resistivity electrode 112 may be formed of a low resistivity meta containing material which has a specific resistivity lower than the first and second work function liners 113 and 115 and is reactive with the second work function liner 115.

According to the third embodiment, the first work function liner 113 may include titanium aluminum nitride, and the second work function liner 115 may include N-type doped polysilicon. The first low resistivity electrode 112 and the second low resistivity electrode 114 may include tungsten. The lower barrier 120 and the upper barrier 119 may include titanium nitride.

Hereafter, a method for fabricating the semiconductor device in accordance with the first embodiment will be described.

FIGS. 5A to 5G are cross-sectional views describing an example of a method for fabricating the semiconductor device in accordance with the first embodiment. FIGS. 6A to 6G are plan views taken along the line A-A' of FIGS. 5A to 5G.

Figure 5A:
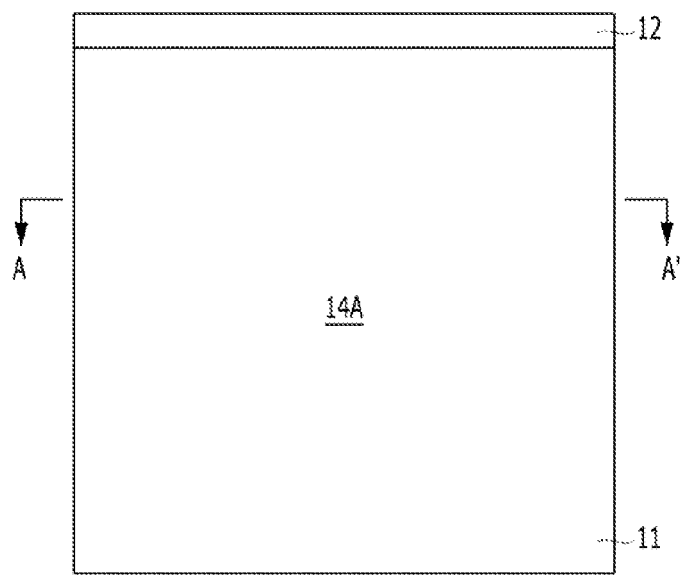
FIGS. 5A to 5G are cross-sectional views describing an example of a method for fabricating the semiconductor device in accordance with the first embodiment.
Figure 6A:
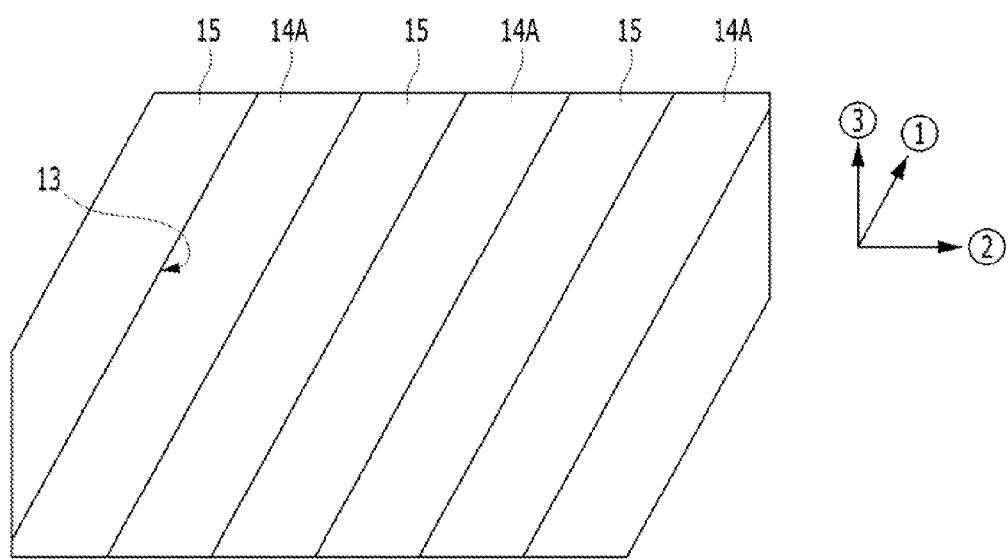
FIGS. 6A to 6G are plan views taken along the line A-A' of FIGS. 5A to 5G, respectively.

As shown in FIGS. 5A and 6A, a hard mask pattern 12 is formed on a substrate 11. The hard mask pattern 12 may be formed by etching a hard mask layer (not shown) by using an isolation mask (not shown). The hard mask pattern 12 may be a line-and-space type pattern. The hard mask pattern 12 may be formed by a spacer pattern technology (SPT) process. The hard mask pattern 12 may be formed of a material which has etch selectivity to the substrate 11. For example, the hard mask pattern 12 may include silicon nitride.

First isolation trenches 13 may be formed. The substrate 11 is etched by using the hard mask pattern 12 as an etch mask. The first isolation trenches 13 of a line type may be formed. Line type active regions 14A may be defined by the first isolation trenches 13. The spaces between the line type active regions 14A may be the first isolation trenches 13. The line type active regions 14A may extend in the first direction ①. For the sake of convenience, in the description the first direction ① is referred to as an oblique direction.

A first isolation layer 15 may be formed in the first isolation trenches 13. The first isolation layer 15 may include silicon oxide, silicon nitride or a combination thereof. Chemical vapor deposition (CVD) or another deposition process may be formed to fill the first isolation trenches 13 with a dielectric material. A planarization process such as chemical-mechanical polishing (CMP) may be additionally used. In the first embodiment, the first isolation layer 15 may include silicon oxide such as a spin-on-dielectric (SOD).

Figure 5B:
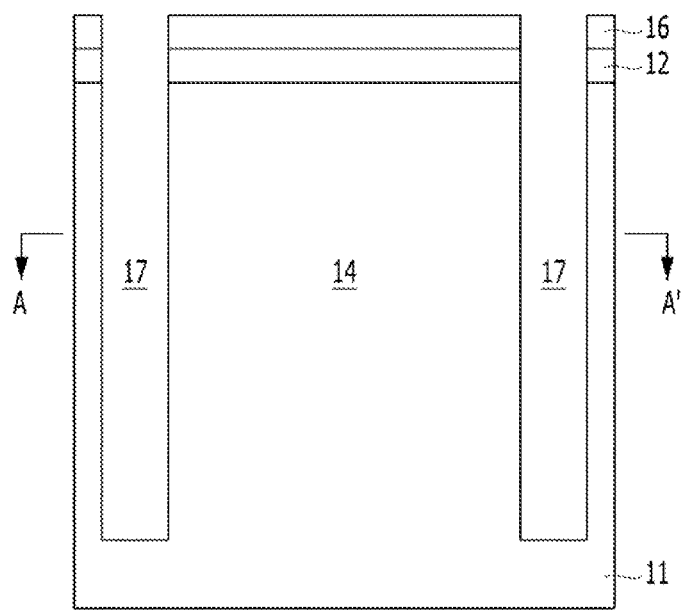
Figure 6B:
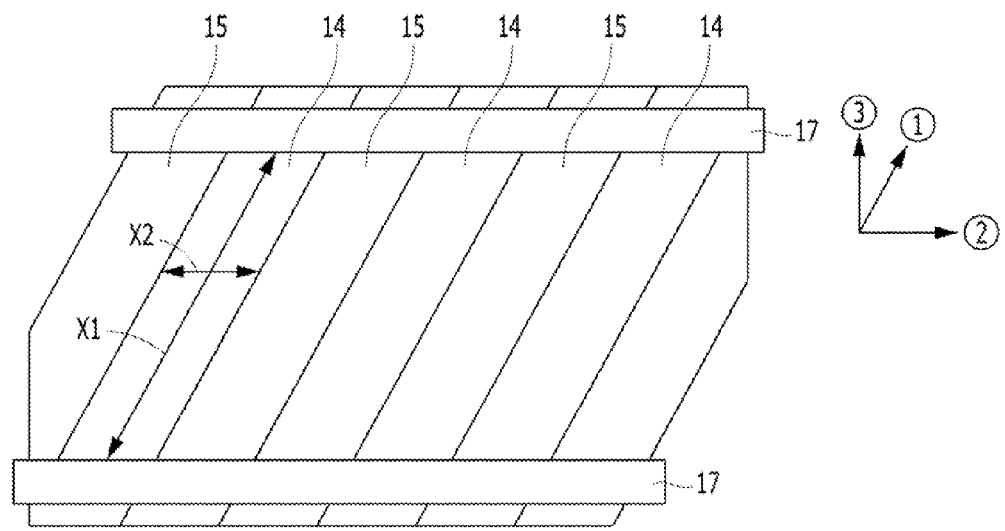

As shown in FIGS. 5B and 6B, the line type active regions 14A may be divided into multiple portions. To divide the line type active regions 14A, a first cutting mask 16 may be applied. The first cutting mask 16 may be a line type. The first cutting mask 16 may extend in the second direction ②. The first cutting mask 16 may extend in a direction crossing with the line type active regions 14A. The first cutting mask 16 may include a photoresist pattern. By using the first cutting mask 15 as an etch mask, the hard mask pattern 12, the line type active regions 14A and the first isolation layer 15 are etched. The line type active regions 14A may be cut, and independent island type active regions 14 may be formed. When viewed in the first direction ①, adjacent island type active regions 14 may be uniform in length and spacing, and may be separated from one another by second isolation trenches 17. Each of the island type active regions 14 may have a major axis X1 and a minor axis X2. Each second isolation trench 17 may be formed between the major axes X1 of adjacent island type active regions 14, and the first isolation layer 15 may be positioned between the minor axes X2 of adjacent island type active regions 14. The second isolation trenches 17 may extend in the second direction ②.

Figure 5C:
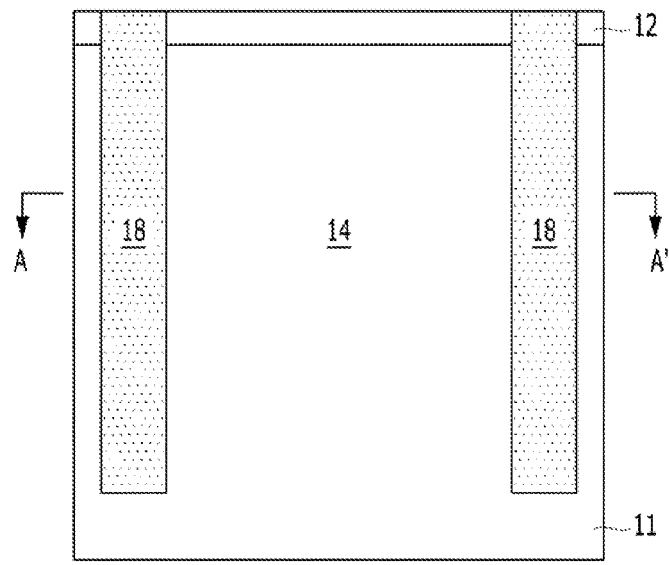
Figure 6C:
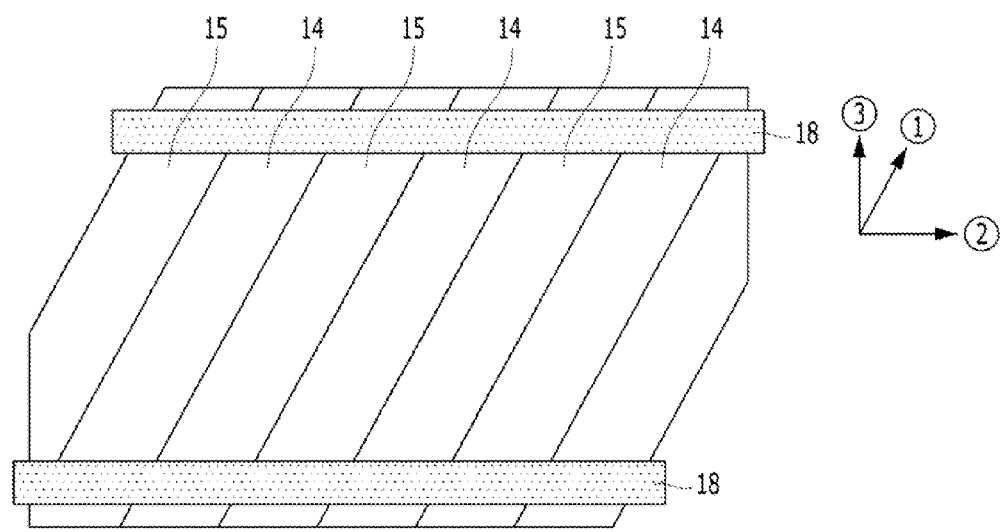

As shown in FIGS. 5C and 6C, a second isolation layer 18 may fill in the second isolation trenches 17. The second isolation layer 18 may include silicon oxide, silicon nitride or a combination thereof. Chemical vapor deposition (CVD) or another deposition process may be formed to fill the second isolation trenches 17 with a dielectric material. A planarization process such as chemical-mechanical polishing (CMP) may be additionally used. In the first embodiment, the second isolation layer 18 may be formed of a material which has an etch selectivity to the first isolation layer 15. For example, the second isolation layer 18 may include silicon nitride.

Figure 5D:
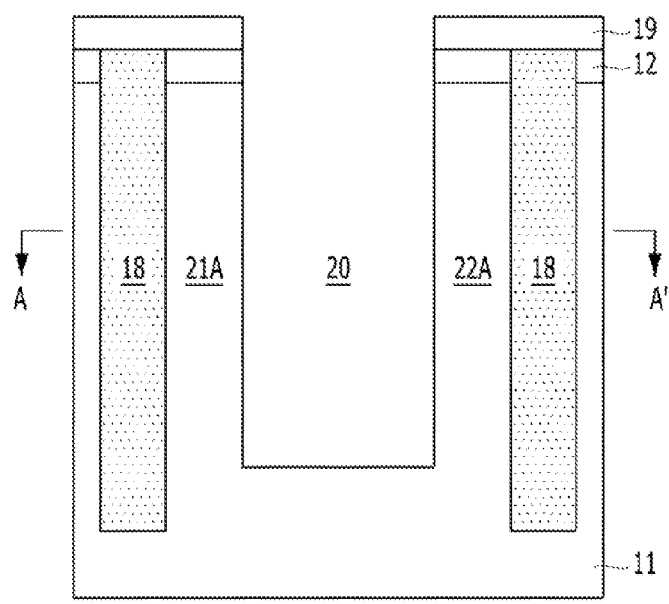
Figure 6D:
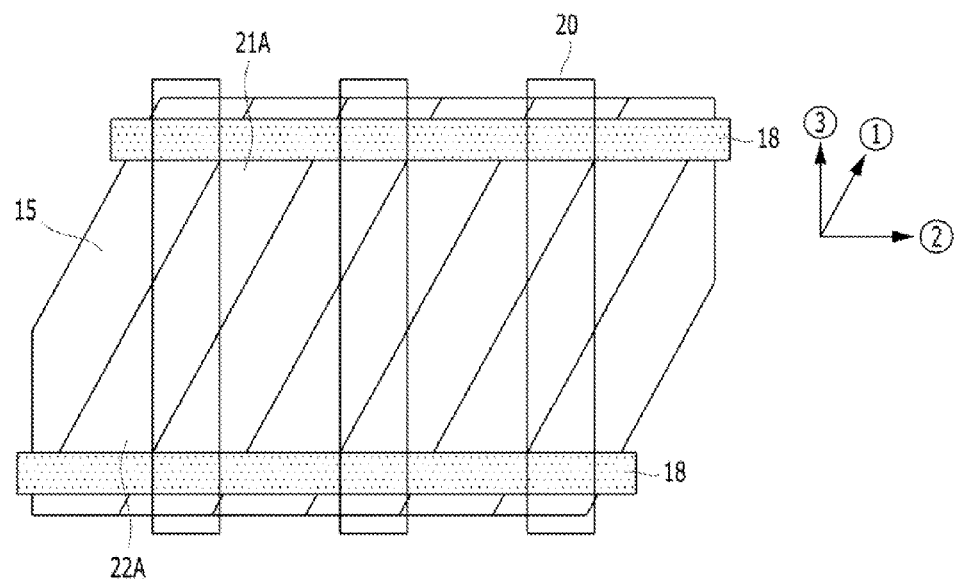

As shown in FIGS. 5D and 6D, a bit line mask 19 may be formed. The bit line mask 19 may include a hard mask layer or a photoresist pattern.

Bit line trenches 20 may be formed. The island type active regions 14 are etched by using the bit line mask 19 as an etch mask. As a result, line type bit line trenches 20 may be formed. The bit line trenches 20 may extend in the third direction ③. The bit line trenches 20 may extend in a direction perpendicular to the second isolation trenches 17. The bit line trenches 20 may be formed to be shallower than the first and second isolation trenches 13 and 17. To form the bit line trenches 20, not only the island type active regions 14 but also the first isolation layer 15 and the second isolation layer 18 may be etched. See FIG. 6D.

Each island type active region 14 may be divided into a pair of preliminary pillars 21A and 22A by the bit line trench 20. The preliminary pillars 21A and 22A may be positioned on a body. As a result, each island type active region 14 may be changed into a structure which includes the body and the pair of preliminary pillars 21A and 22A.

Figure 5E:
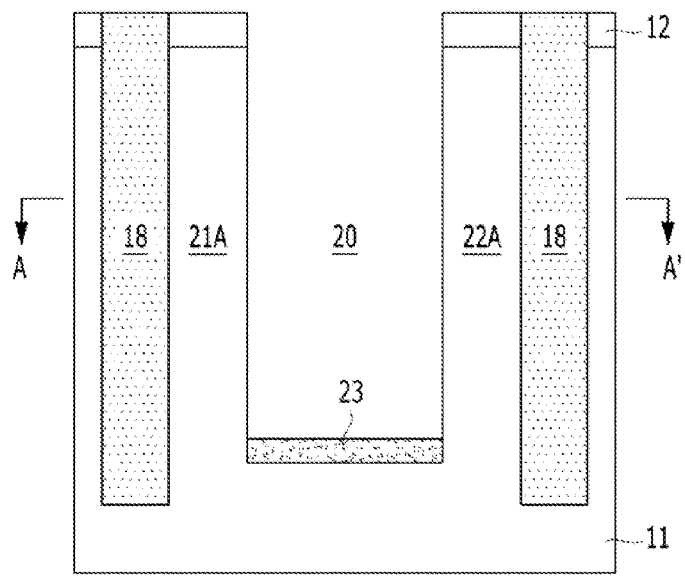
Figure 6E:
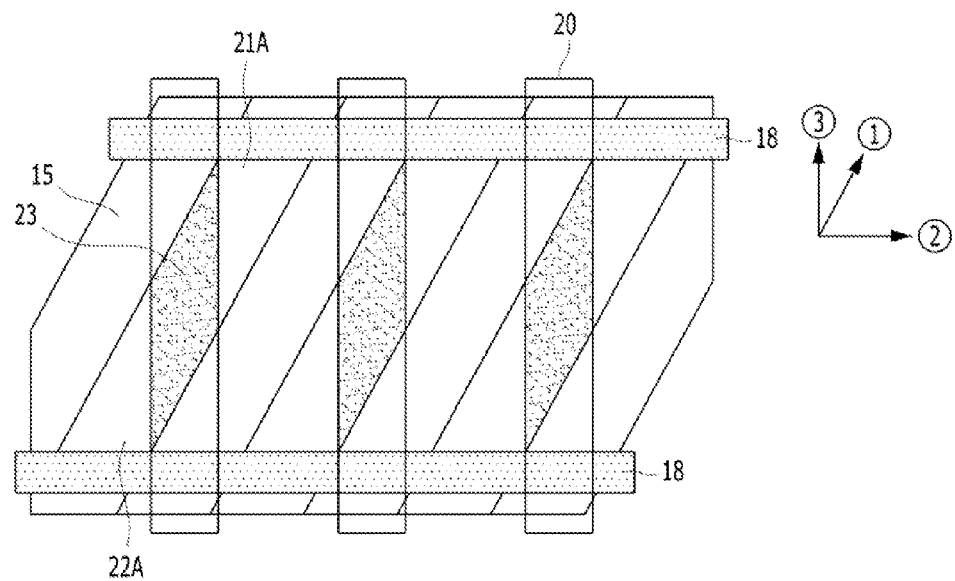

As shown in FIGS. 5E and 6E, first junction regions 23 may be formed. To form the first junction regions 23, an impurity doping process is performed by implantation or another doping technology. For example, the first junction regions 23 are formed by implanting an impurity into the bottom surfaces of the bit line trenches 20. In the doping process, the impurity may include an N-type impurity or a P-type impurity. For example, phosphorus (P) or arsenic (As) may be used as the impurity.

Figure 5F:
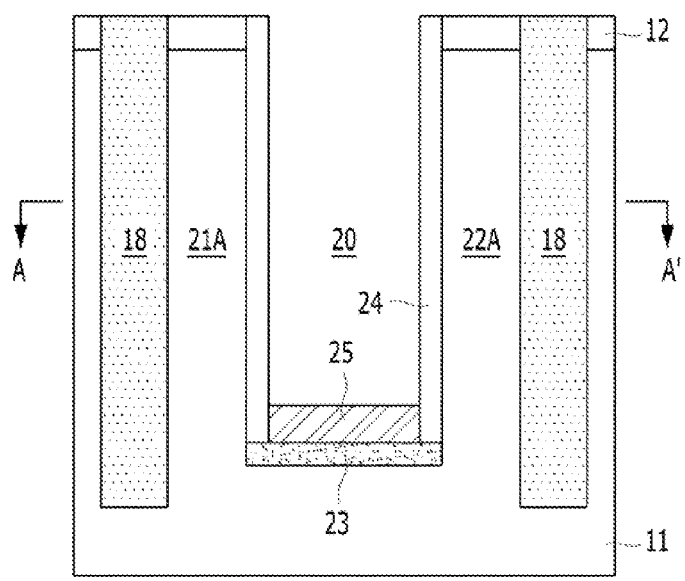
Figure 6F:
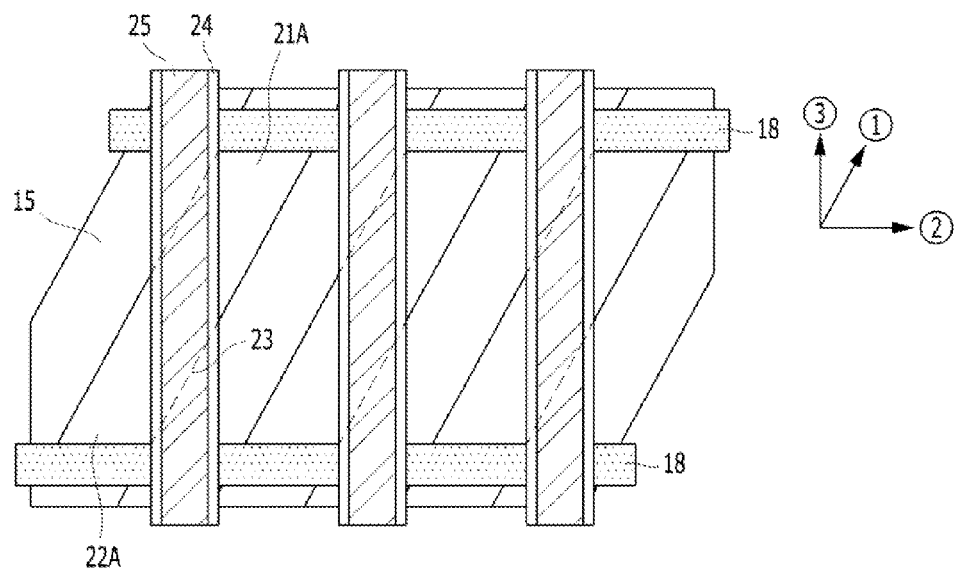

As shown in FIGS. 5F and 6F, sacrificial spacers 24 and bit lines 25 may be formed. For example, after conformally forming a sacrificial spacer layer on the entire surface including the bit line trenches 20, by etching back the sacrificial spacer layer, the sacrificial spacers 24 may be formed. Next, after forming a metal layer (not shown) to fill the bit line trenches 20, the metal layer is etched to form bit lines 25 which fill the bottom portions of the bit line trenches 20. The bit lines 25 may include tungsten W. The bit lines 25 may be electrically coupled with the first junction regions 23.

Figure 5G:
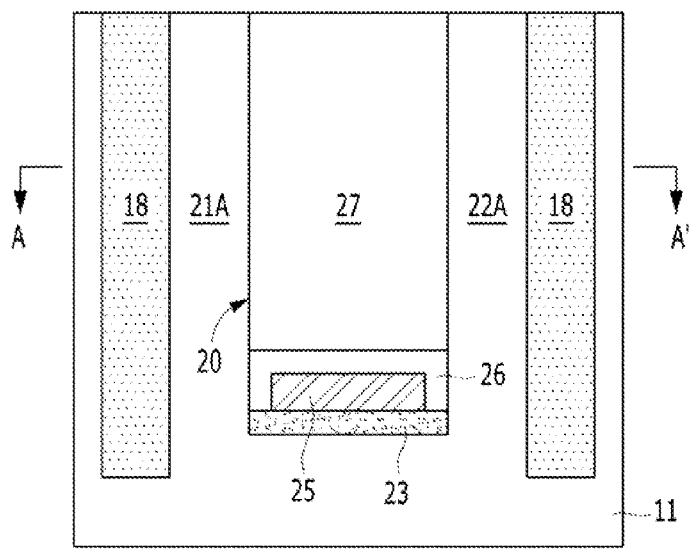
Figure 6G:
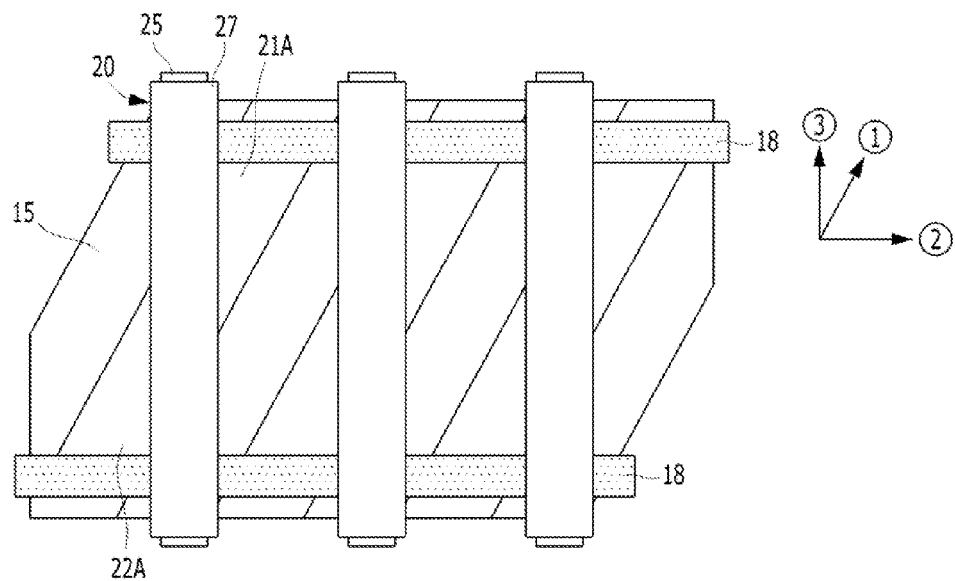

As shown in FIGS. 5G and 6G, the sacrificial spacers 24 are removed.

To cover the bit lines 25, a bit line capping layer 26 is formed to fill the bit line trenches 20. The bit line capping layer 26 may include silicon nitride.

The bit line capping layer 26 may be recessed by planarization and etch-back processes. In the planarization process for the bit line capping layer 26, the hard mask pattern 12 may be removed.

A gap fill layer 27 is formed on the bit line capping layer 26. The gap fill layer 27 may be formed of silicon oxide such as a spin-on-dielectric (SOD). The gap fill layer 27 may be planarized by chemical-mechanical polishing (CMP).

FIGS. 7A to 7K are cross-sectional views describing an example of a method for forming the gate electrode of the semiconductor device in accordance with the first embodiment. FIGS. 8A to 8K are plan views taken along the line A-A' of FIGS. 7A to 7K.

Figure 7A:
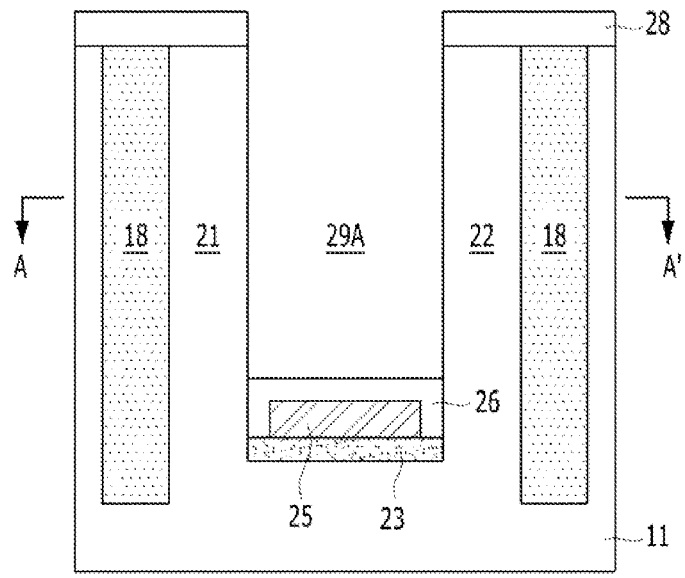
FIGS. 7A to 7K are cross-sectional views describing an example of a method for forming the gate electrode of the semiconductor device in accordance with the first embodiment.
Figure 8A:
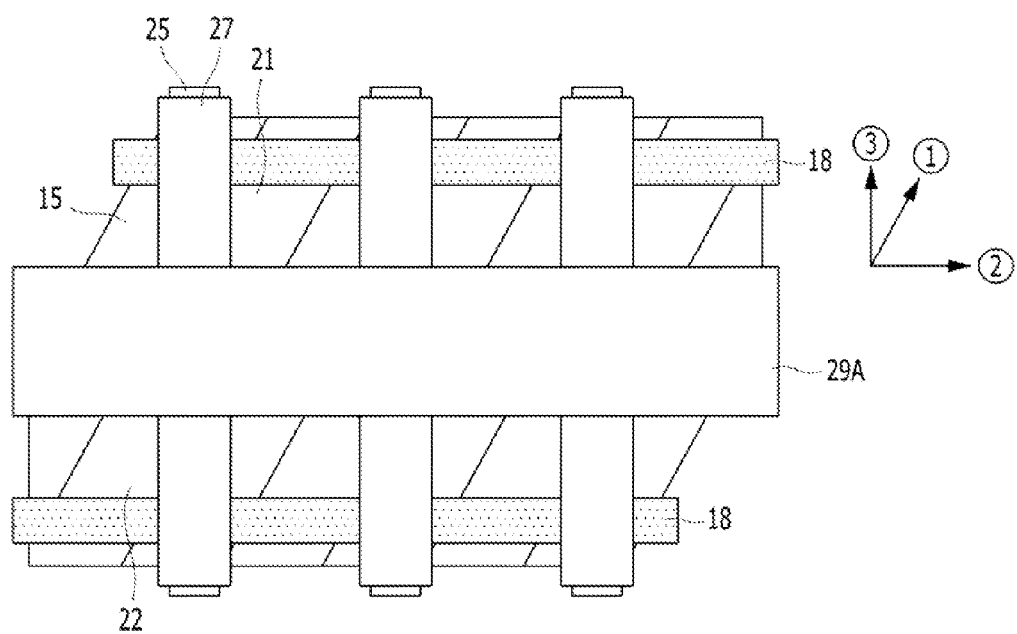
FIGS. 8A to 8K are plan views taken along the line A-A' of FIGS. 7A to 7K, respectively.

As shown in FIGS. 7A and 8A, a gate trench 29A may be formed. For example, a gate mask 28 is formed to define regions in which gate electrodes are formed. By etching the gap fill layer 27, the first isolation layer 15 and the preliminary pillars 21A and 22A using the gate mask 28, the gate trench 29A is formed. An etching process for forming the gate trench 29A is stopped at the bit line capping layer 26. Pairs of first and second pillars 21 and 22 may be formed by the gate trench 29A. The first and second pillars 21 and 22 may be formed by etching the preliminary pillars 21A and 22A.

Figure 7B:
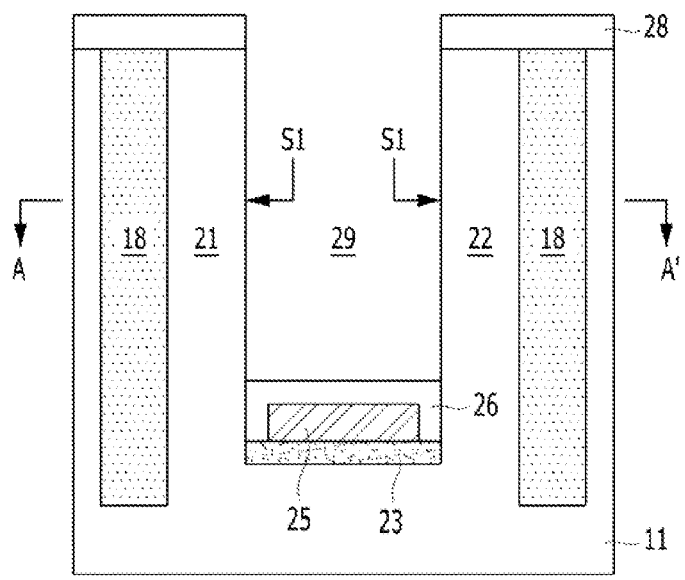
Figure 8B:
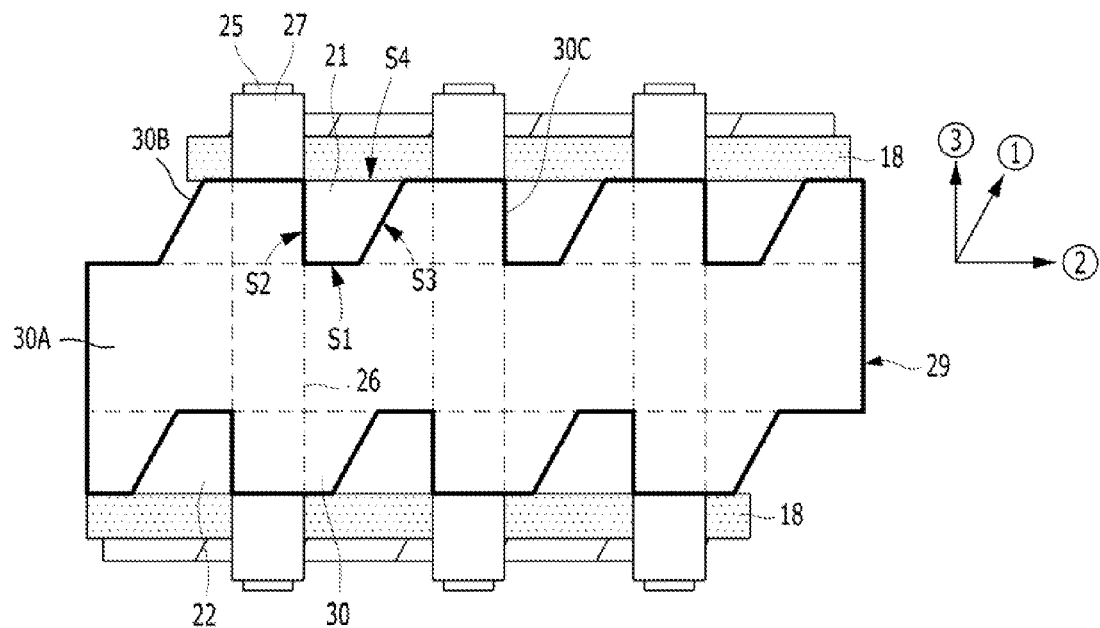

As shown in FIGS. 7B and 8B, a widening process for the gate trench 29A may be performed. For example, by performing a wet etching process, the gap fill layer 27 and the first isolation layer 15 are selectively etched. This is referred to as a widening process. As the first isolation layer 15 and the gap fill layer 27 are etched by wet etching, a gate trench 29 may be formed. The gate trench 29 may include a main trench 30A, first branch trenches 30B and second branch trenches 30C. The main trench 30A may extend in the second direction ②. The main trench 30A may be positioned between the first pillars 21 and the second pillars 22. The first branch trenches 30B and the second branch trenches 30C may be positioned between adjacent first pillars 21 in the second direction ②. Also, the first branch trenches 30B and the second branch trenches 30C may be positioned between adjacent second pillars 22 in the second direction ②. The side surfaces of the first and second pillars 21 and 22 may be exposed by the main trench 30A, the first branch trenches 30B and the second branch trenches 30C. For example, first side surfaces S1, second side surfaces S2 and third side surfaces S3 may be exposed. The first side surfaces S1 may be exposed by the main trench 30A, and the second side surfaces S2 and the third side surfaces S3 may be respectively exposed by the first branch trenches 30B and the second branch trenches 30C. The first branch trenches 30B and the second branch trenches 30C may be the same as each other in terms of size and shape. The first and second pillars 21 and 22 further include fourth side surfaces S4 and the fourth side surfaces S4 may contact the second isolation layer 18. The widening of the first branch trenches 30B and the second branch trenches 30C may be stopped when the second isolation layer 18 is exposed.

Figure 7C:
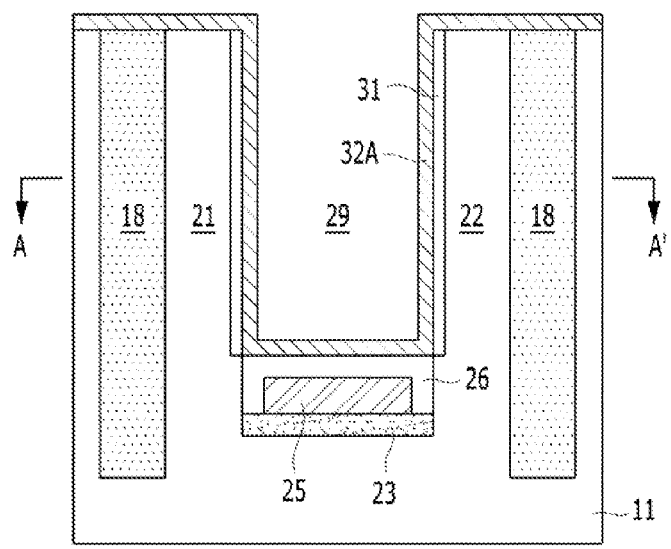
Figure 8C:
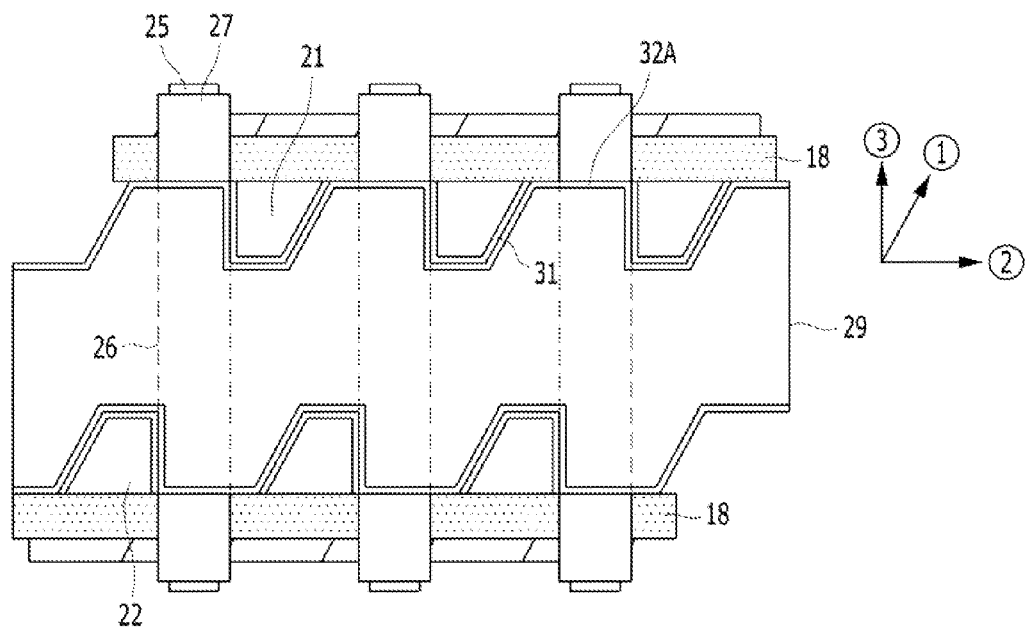

As shown in FIGS. 7C and 8C, a gate dielectric layer 31 may be formed on a sidewall of the gate trench 29.

The gate dielectric layer 31 may be formed by a thermal oxidation process. In another embodiment, the gate dielectric layer 31 may be formed by chemical vapor deposition (CVD) or atomic layer deposition (ALD). The gate dielectric layer 31 may include a high-k material, an oxide, a nitride, an oxynitride or a combination thereof. The high-k material may include a hafnium-containing material. The hafnium-containing material may include hafnium oxide, hafnium silicon oxide, hafnium silicon oxynitride or a combination thereof. In another embodiment, the high-k material may include lanthanum oxide, lanthanum aluminum oxide, zirconium oxide, zirconium silicon oxide, zirconium silicon oxynitride, aluminum oxide or a combination thereof. As the high-k material, other high-k materials known in the art may be selectively used.

A first work function liner layer 32A may be formed on the gate dielectric layer 31. The first work function liner layer 32A may be conformally formed on the surface of the gate dielectric layer 31. The first work function liner layer 32A has a work function higher than silicon having a mid-gap work function (4.5 eV). The first work function liner layer 32A may be referred to as a high work function layer. The first work function liner layer 32A may be formed of a metal-containing material. The first work function liner layer 32A may include aluminum-containing titanium nitride. The aluminum-containing titanium nitride may also be referred to as titanium aluminum nitride (TiAlN) or aluminum-doped titanium nitride (Ai-doped TiN). As a method for forming the aluminum-doped titanium nitride (Al-doped TiN) after depositing titanium nitride (TiN), doping such as, aluminum implantation may be performed. As a method for forming the titanium aluminum nitride (TiAlN), an aluminum-containing material may be added during a deposition process, which deposition of titanium nitride (TiN) is performed to dope aluminum in situ. For example, when depositing titanium nitride (TiN) by chemical vapor deposition (CVD), a titanium source material, a nitrogen-containing material and an aluminum source material are simultaneously flowed. The titanium aluminum nitride (TiAlN) has a work function higher than the titanium nitride (TiN).

Figure 7D:
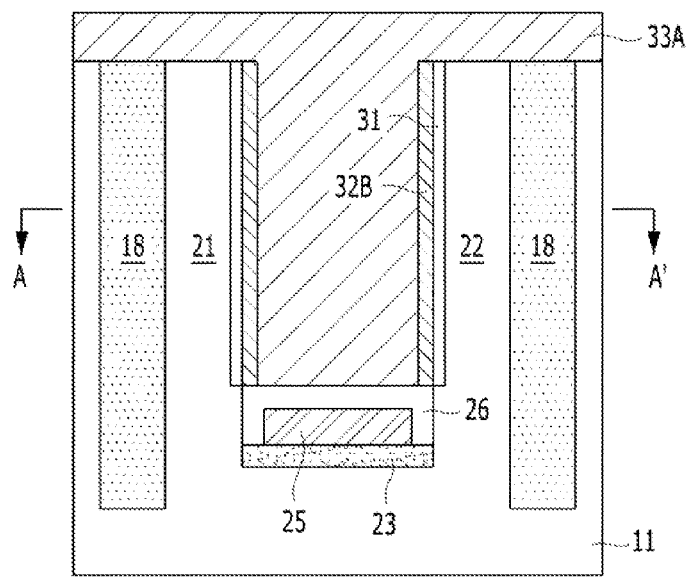
Figure 8D:
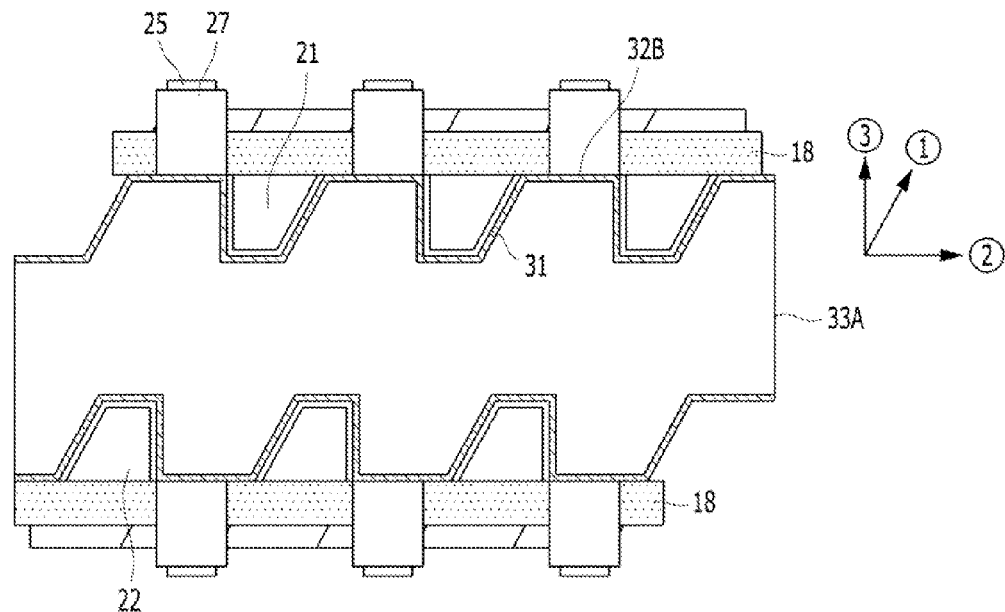

As shown in FIGS. 7D and 8D, preliminary first work function liners 32B may be formed. The preliminary first work function liners 32B may be formed by an etch-back of the first work function liner layer 32A. The preliminary first work function liners 32B may be formed over the side surfaces of the first and second pillars 21 and 22, and the gate dielectric layer 31 is interposed therebetween.

A first low resistivity layer 33A may be formed on the preliminary first work function liners 32B. The first low resistivity layer 33A may fill the gate trench 29. The first low resistivity layer 33A includes a low resistivity metal material. The first low resistivity layer 33A may be formed of a material which does not contain an impurity such as fluorine to prevent fluorine from causing damage to the gate dielectric layer 31. Further, the first low resistivity layer 33A may be formed of a non-reactive material to a second work function liner layer to be subsequently formed. The first low resistivity layer 33A may be formed of titanium nitride. The first low resistivity layer 33A may be formed by chemical vapor deposition (CVD) or atomic layer deposition (ALD).

Figure 7E:
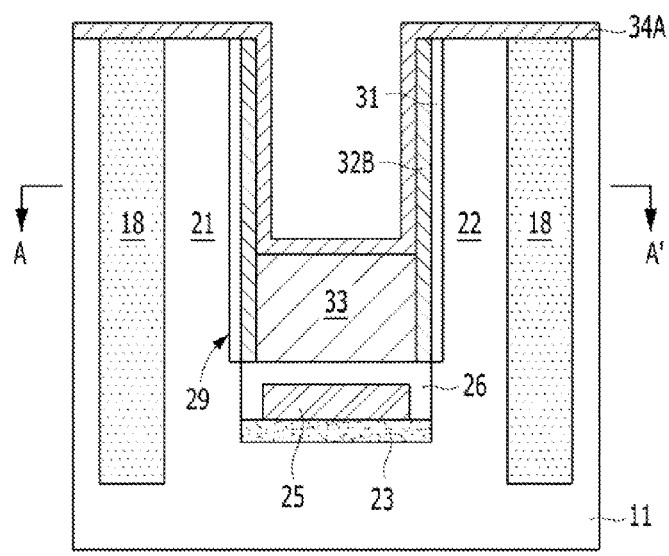
Figure 8E:
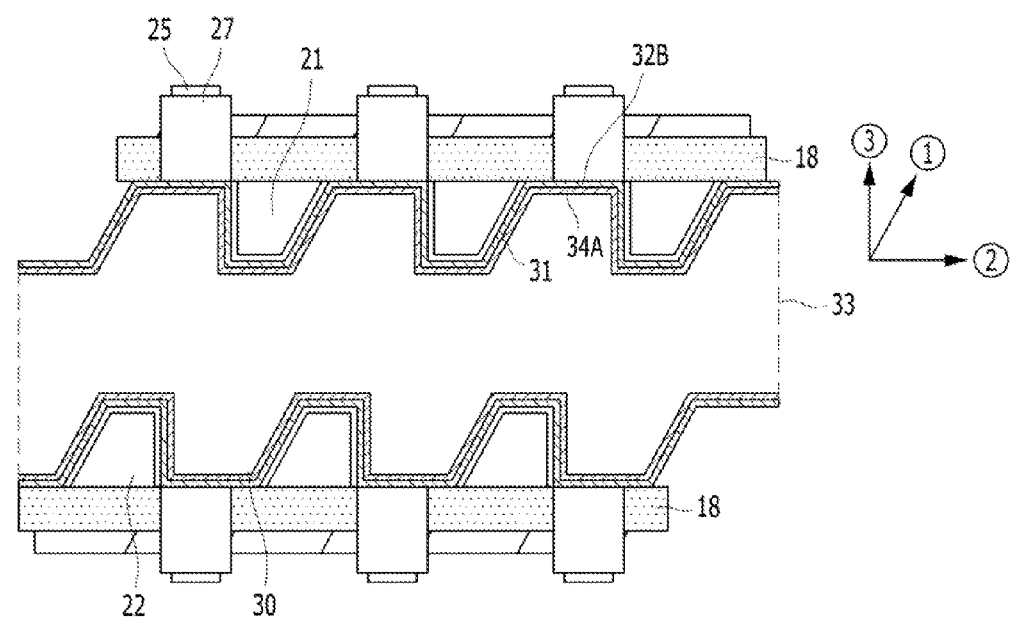

As shown in FIGS. 7E and 8E, a first recessing process is performed in such a manner that first low resistivity electrodes 33 remain in the gate trench 29. The first recessing process may be performed by dry etching, for example, an etch-back process. The first low resistivity electrodes 33 are formed by the etch-back process for the first low resistivity layer 33A. In another embodiment, the first recessing process may be performed in such a manner that a planarization process and an etch-back process are sequentially performed.

The first low resistivity electrodes 33 may be recessed to be lower than the top surfaces of the first and second pillars 21 and 22.

A second work function liner layer 34A may be formed. The second work function liner layer 34A may extend over the surfaces of the first low resistivity electrodes 33 and the preliminary first work function liners 32B. The second work function liner layer 34A may be a work function material different from the preliminary first work function liners 32B. The second work function liner layer 34A includes a low work function material. The second work function liner layer 34A may be formed of a non-metal material. The second work function liner layer 34A may include polysilicon doped with an N-type impurity.

Figure 7F:
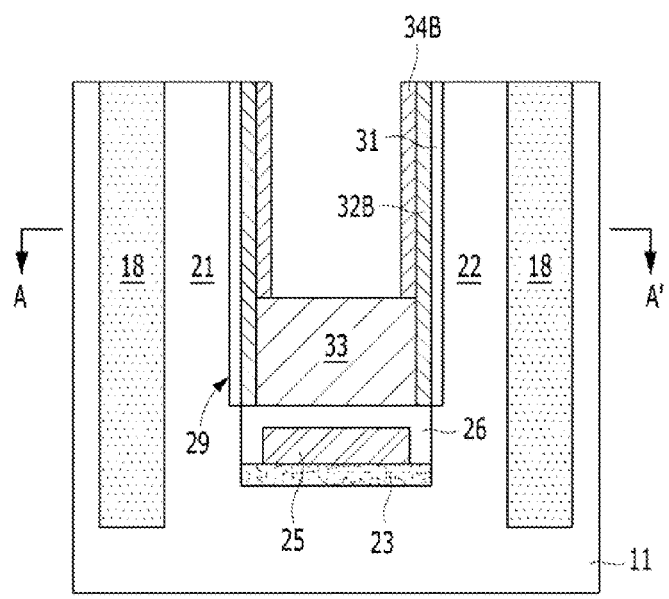
Figure 8F:
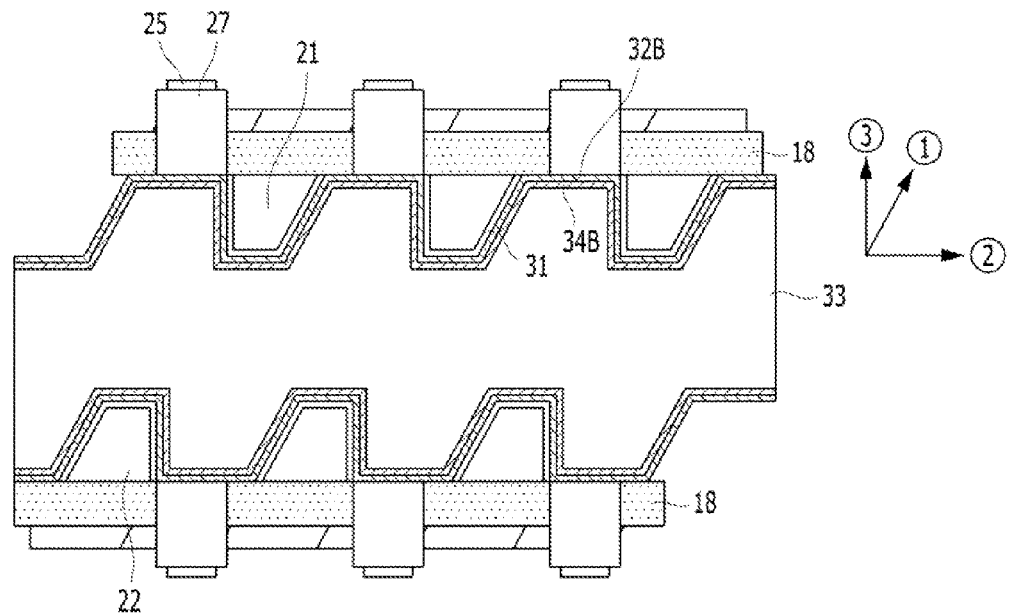

As shown in FIGS. 7F and 8F, a second recessing process may be performed for the second work function liner layer 34A. Namely, the second work function liner layer 34A may be etched. For example, second work function liner layer 34A may be etched back. As a result, preliminary second work function liners 34B may be formed. The preliminary second work function liners 34B may cover the side surfaces of the first and second pillars 21 and 22, and the preliminary first work function liners 32B and the gate dielectric layer 31 are interposed between the preliminary second work function liners 34B and the side surfaces of the first and second pillars 21 and 22. By the preliminary second work function liners 34B, the top surfaces of the first low resistivity electrodes 33 may be exposed. The preliminary second work function liners 34B and the preliminary first work function liners 32B may contact each other. The preliminary second work function liners 34B and the preliminary first work function liners 32B may be formed to the same thickness.

Figure 7G:
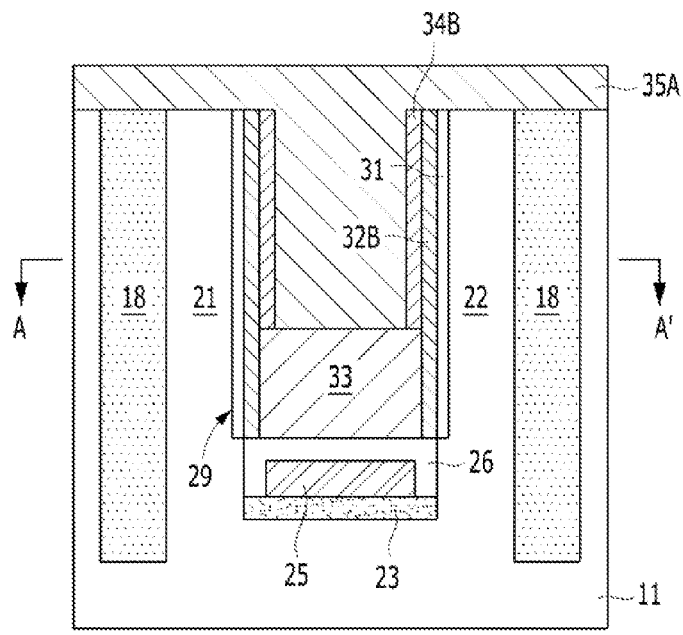
Figure 8G:
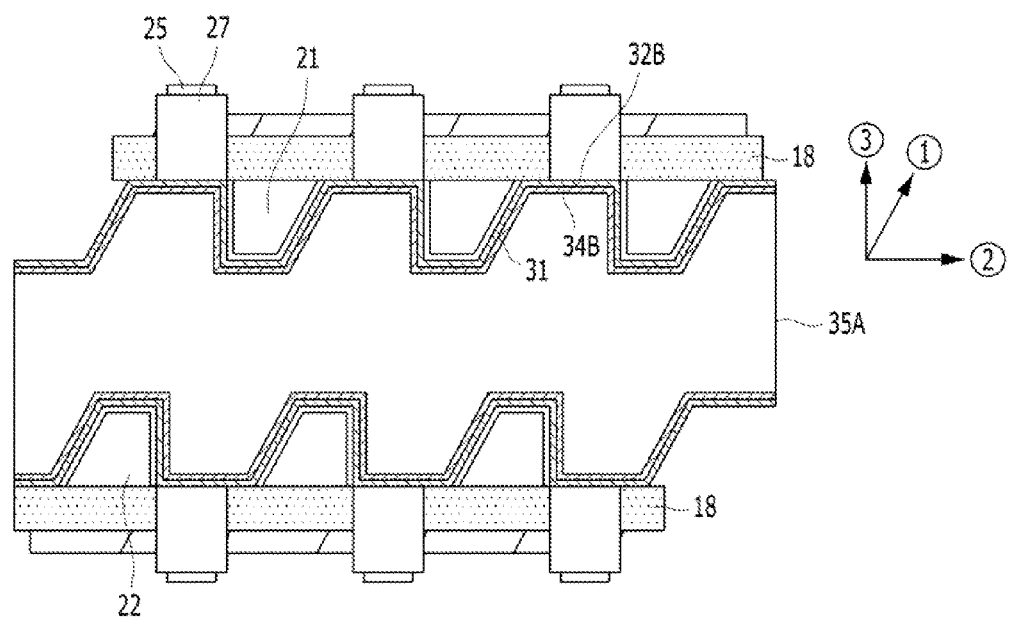

As shown in FIGS. 7G and 8G a second low resistivity layer 35A may be formed on the preliminary second work function liners 34B. The second low resistivity layer 35A may fill the remaining portion of the gate trench 29. The second low resistivity layer 35A may be formed of the same material as the first low resistivity electrodes 33. The second low resistivity layer 35A includes a low resistivity metal material. The second low resistivity layer 35A may be formed of a non-reactive material to the preliminary second work function liners 34B. The second low resistivity layer 35A may be formed of titanium nitride. The second low resistivity layer 35A may be formed by chemical vapor deposition (CVD) or atomic layer deposition (ALD).

Figure 7H:
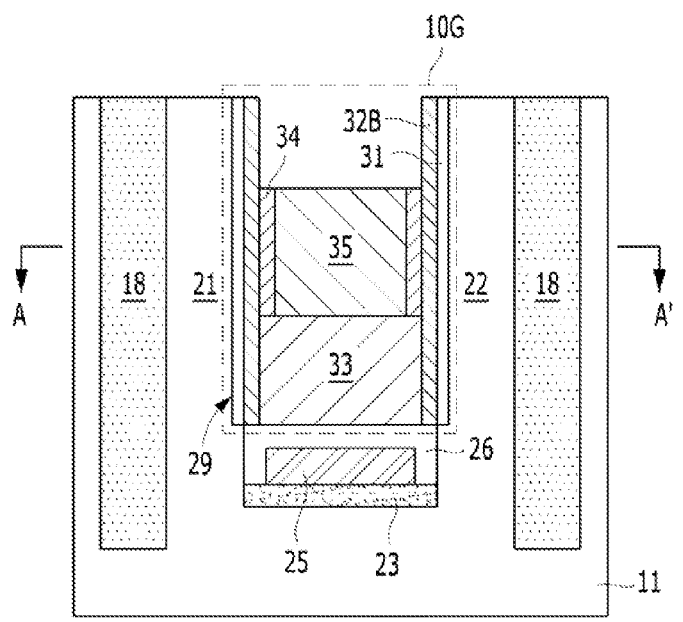
Figure 8H:
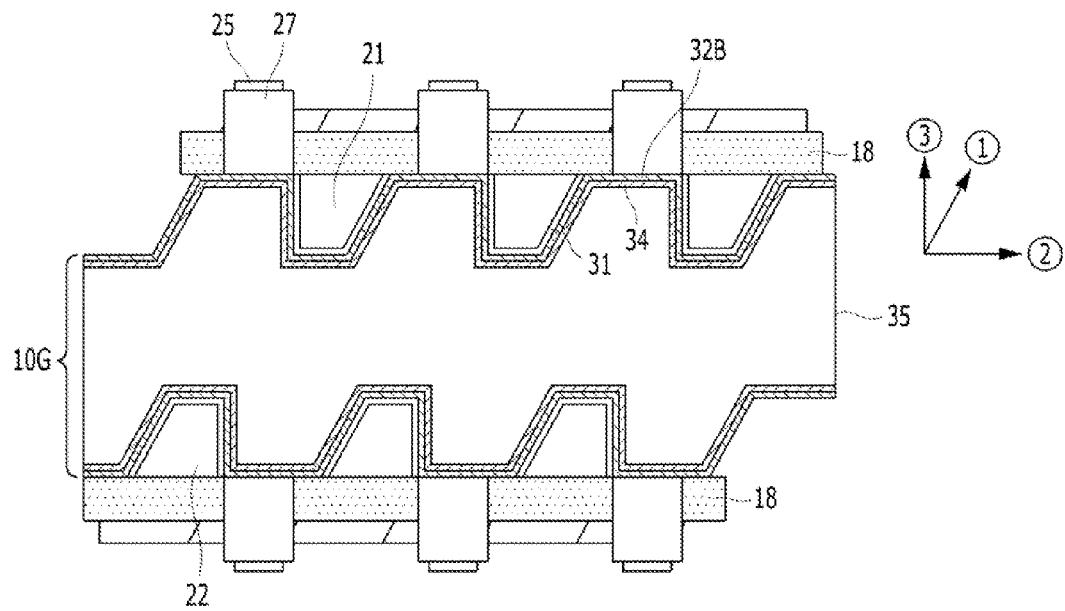

As shown in FIGS. 7H and 8H, a third recessing process is performed in such a manner that second low resistivity electrodes 35 and second work function liners 34 remain in the gate trench 29. The third recessing process may be performed by dry etching, for example, an etch-back process. As a result, the second low resistivity electrodes 35 and the second work function liners 34 may be formed. The second low resistivity electrodes 35 are formed by the etch-back process for the second low resistivity layer 35A. The second work function liners 34 are formed by the etch-back process for the preliminary second work function liners 34B. In another embodiment, the third recessing process may be performed in such a manner that a planarization process and an etch-back process are sequentially performed.

In this way, when the third recessing process is completed, preliminary gate electrodes 10G may be formed in the gate trench 29.

The top surfaces of the preliminary gate electrodes 10G are positioned to be lower than the top surfaces of the first and second pillars 21 and 22. In this structure, the physical distance between each second low resistivity electrode 35 and a surrounding conductor for example, a contact plug, may be sufficiently secured.

Figure 7I:
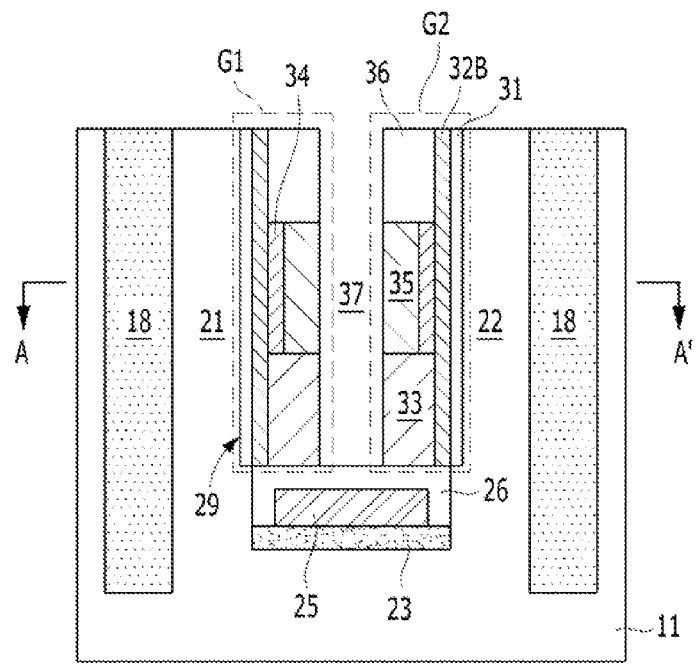
Figure 8I:
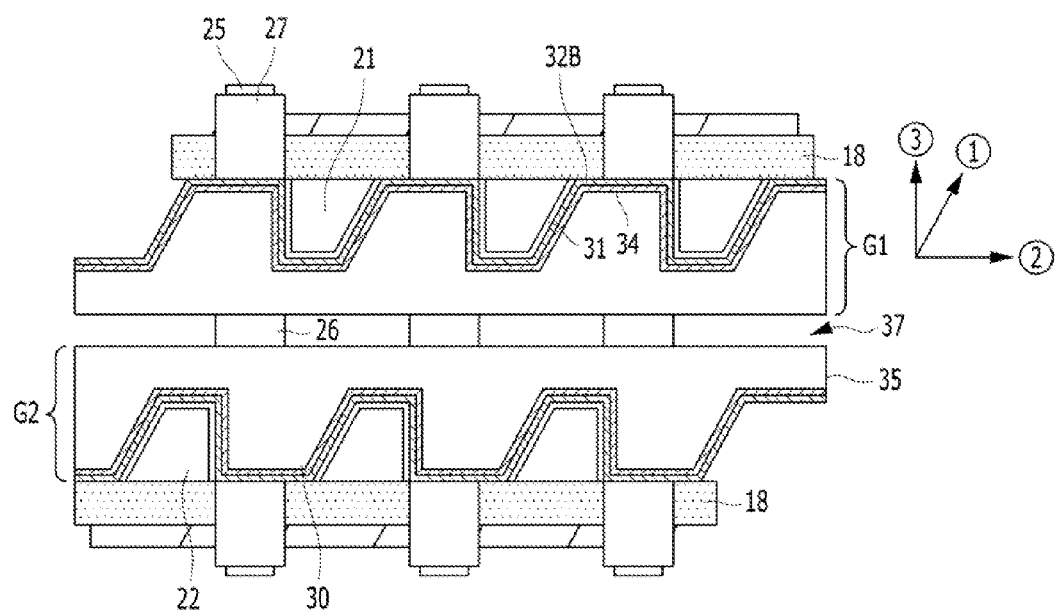

As shown in FIGS. 7I and 8I, by etching the center portions of the preliminary gate electrodes 10G using a second cutting mask 36, pairs of first and second gate electrodes G1 and G2 and gate separation trenches 37 may be formed. The second cutting mask 36 may cover the side surfaces of the gate trench 29 on the preliminary gate electrodes 10G. For example, after forming a mask material on the entire surface including the preliminary gate electrodes 10G, the second cutting mask 36 may be formed by etching back the mask material. The second cutting mask 36 may be formed of a material which has etch selectivity to the preliminary gate electrodes 10G.

In this way, by cutting the preliminary gate electrodes 10G, the first gate electrodes G1 and the second gate electrodes G2 may be formed. The first gate electrodes G1 and the second gate electrodes G2 may be embedded in the gate trench 29.

Figure 7J:
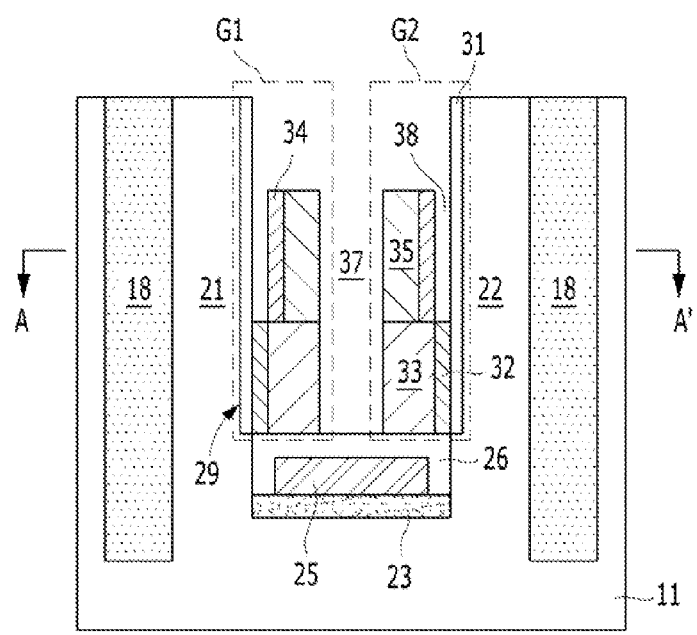
Figure 8J:
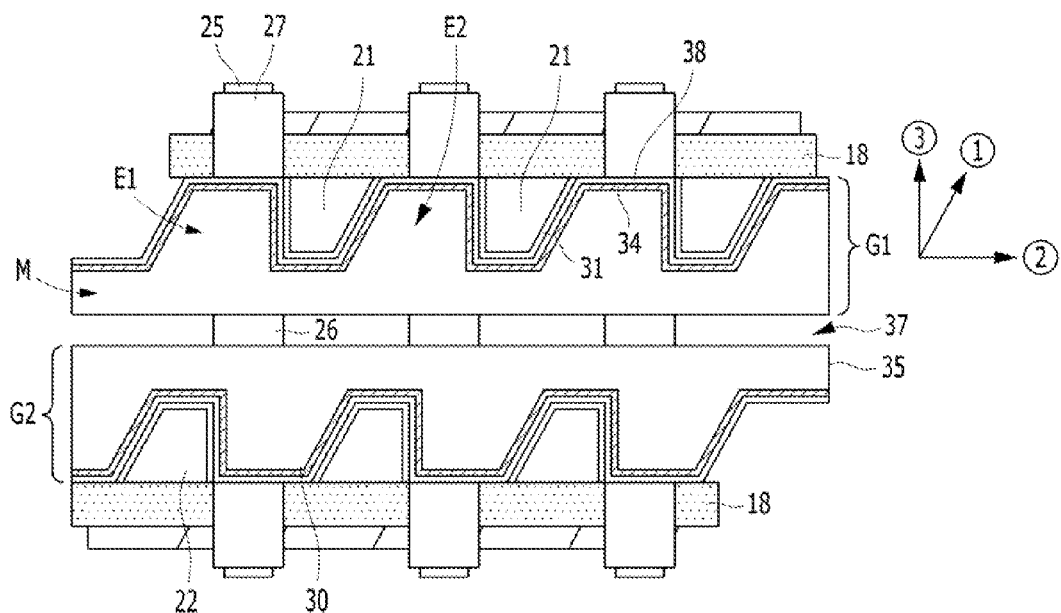

As shown in FIGS. 7J and 8J, the preliminary first work function liners 32B are recessed. As a result, gaps 38 may be formed. First work function liners 32 are recessed and remain under the gaps 38. The first work function liners 32 and the second work function liners 34 may not contact each other. That is, the first work function liners 32 and the second work function liners 34 may not overlap with each other. The gaps 38 may be positioned between the second work function liners 34 and the gate dielectric layer 31. The second cutting mask 36 may be removed.

According to the above descriptions, the first and second gate electrodes G1 and G2 may become symmetrical to each other to the gate separation trenches 37. The bit line capping layer 26 may be exposed under the gate separation trenches 37. The first and second gate electrodes G1 and G2 may include main parts M, which are positioned between the first pillars 21 and the second pillars 22, and first branch parts E1 and second branch parts E2, which are positioned on the side surfaces of the first pillars 21 and the second pillars 22. By the main parts M, the first branch parts E1 and the second branch parts E2, at least three side surfaces of the first and second pillars 21 and 22 may overlap with the first and second gate electrodes G1 and G2. The fourth side surfaces S4 of the first and second pillars 21 and 22 may not overlap with the first and second gate electrodes G1 and G2.

Figure 7K:
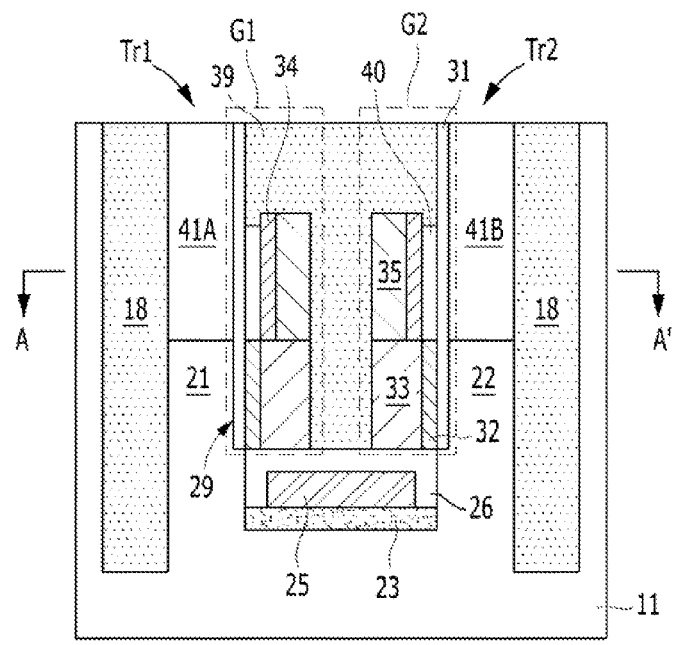
Figure 8K:
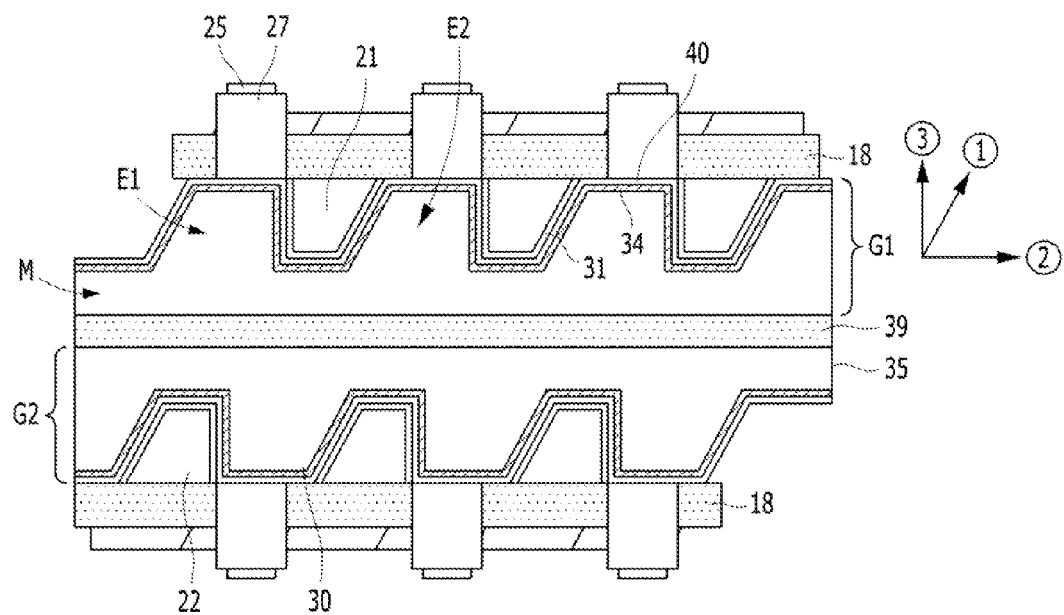

As shown in FIGS. 7K and 8K, a gate capping layer 39 is formed to fill the gate separation trenches 37. At this time since the gaps 38 are narrow, they are not filled with the gate capping layer 39 and remain as empty spaces to form air gaps 40. Accordingly, the air gaps 40 may be positioned between the second work function liners 34 and the gate dielectric layer 31.

The gate capping layer 39 includes a dielectric material. The gate separation trenches 37 are filled with the gate capping layer 39. The gate capping layer 39 may include silicon nitride. Subsequently, planarization of the gate capping layer 39 may be performed such that the top surfaces of the first and second pillars 21 and 22 are exposed.

After forming the gate capping layer 39, an impurity doping process is performed by implantation or another doping technology. As a result, second junction regions 41A and 41B are formed in the first and second pillars 21 and 22. When performing the impurity doping process, the gate capping layer 39 is used as a barrier. The second junction regions 41A and 41B may become source regions and drain regions. Vertical channel regions may be defined between the first junction regions 23 and the second junction regions 41A and 41B.

In the above descriptions, the first gate electrode G1, the first junction region 23 and the second junction region 41A may form a first transistor Tr1. The second gate electrode G2, the first junction region 23 and the second junction region 41B may form a second transistor Tr2. The first junction region 23 may become a sharing junction region. For example, the first junction region 23 serves as the source/drain regions of the first transistor Tr1 and the second transistor Tr2.

The second junction regions 41A and 41B may have a depth that overlaps with the second work function liners 34. Accordingly, the air gaps 40 and the gate dielectric layer 31 may be positioned between the second work function liners 34 and the second junction regions 41A and 41B. In this way, the air gaps 40 and the second work function liners 34 may overlap with the second junction regions 41A and 41B.

Memory elements may be electrically coupled with the second junction regions 41A and 41B. See FIG. 1.

FIGS. 9A to 9E are cross-sectional views describing an example of a method for forming the gate electrode of the semiconductor device in accordance with the second embodiment.

Figure 9A:
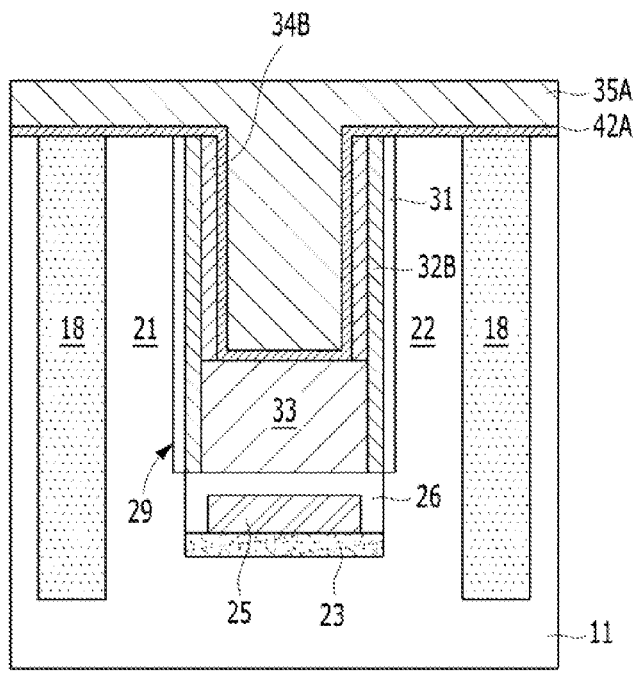
FIGS. 9A to 9E are cross-sectional views describing an example of a method for forming the gate electrode of the semiconductor device in accordance with the second embodiment.

As shown in FIG. 9A, preliminary first work function liners 32B may be formed on the sidewalls of a gate dielectric layer 31. For example, after conformally forming a first work function liner layer (not shown) on the entire surface including the gate dielectric layer 31, the first work function liner layer may be etched by an etch-back process. According to this fact, the preliminary first work function liners 32B which cover the sidewalls of the gate dielectric layer 31 may be formed. The preliminary first work function liners 32B may include titanium aluminum nitride.

A first low resistivity electrode 33 which partially fills a gate trench 29 may be formed on the preliminary first work function liners 32B. The first low resistivity electrode 33 may be recessed to be lower than the top surfaces of first and second pillars 21 and 22.

Preliminary second work function liners 34B may be formed. For example, after forming a second work function liner layer (not shown) on the entire surface including the first low resistivity electrode 33, the second work function liner layer may be etched by an etch-back process. The preliminary second work function liners 34B may be formed on the sidewalls of the preliminary first work function liners 32B on the first low resistivity electrode 33.

The preliminary second work function liners 34B may be a work function material different from the preliminary first work function liners 32B. The preliminary second work function liners 34B include a low work function material. The preliminary second work function liners 34B may be formed of a non-metal material. The preliminary second work function liners 34B may include polysilicon doped with an N-type impurity.

The preliminary second work function liners 34B and the preliminary first work function liners 32B may contact each other. The preliminary second work function liners 34B and the preliminary first work function liners 32B may be formed to the same thickness.

An upper barrier layer 42A may be formed on the preliminary second work function liners 34B. A second low resistivity layer 35A may be formed on the upper barrier layer 42A. The second low resistivity layer 35A may fill the remaining portion of the gate trench 29. The second low resistivity layer 35A may be formed of the same material as the first low resistivity electrode 33. The second low resistivity layer 35A includes a low resistivity metal material. The second low resistivity layer 35A may be formed of a reactive material to the preliminary second work function liners 34B. The second low resistivity layer 35A may be formed of tungsten. The second low resistivity layer 35A may be formed by chemical vapor deposition (CVD) or atomic layer deposition (ALD). The upper barrier layer 42A may be conformally formed. The upper barrier layer 42A may be formed of a metal-containing material. The upper barrier layer 42A may include a metal nitride. For example, the upper barrier layer 42A may include titanium nitride.

Figure 9B:
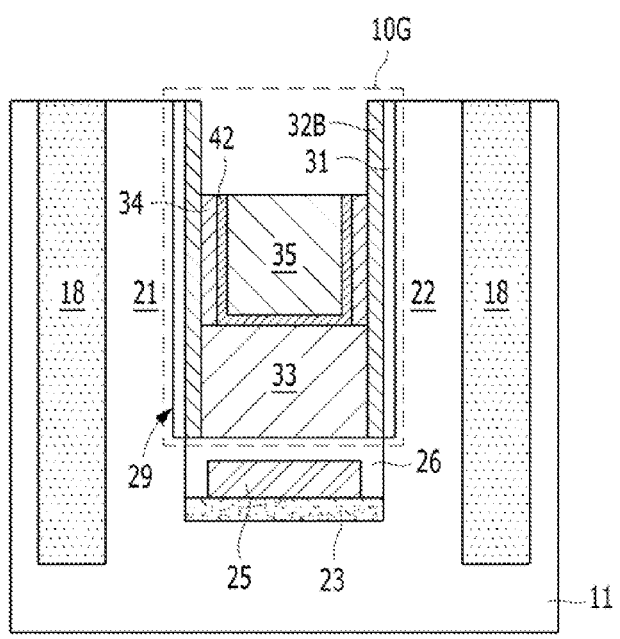

As shown in FIG. 9B, a recessing process is performed in such a manner that an upper barrier 42, a second low resistivity electrode 35 and second work function liners 34 remain in the gate trench 29. The recessing process may be performed by dry etching, for example, an etch-back process. The second low resistivity electrode 35 is formed by the etch-back process for the second low resistivity layer 35A. The upper barrier 42 is formed by the etch-back process for the upper barrier layer 42A. The second work function liners 34 are formed by the etch-back process for the preliminary second work function liners 34B. In another embodiment, the recessing process may be performed in such a manner that a planarization process and an etch-back process are sequentially performed.

In this way, when the recessing process is completed, a preliminary gate electrode 10G may be formed.

The top surface of the preliminary gate electrode 10G is positioned to be lower than the top surfaces of first and second pillars 21 and 22. The physical distance between the second low resistivity electrode 35 and a surrounding conductor for example, a contact plug, may be sufficiently secured.

Figure 9C:
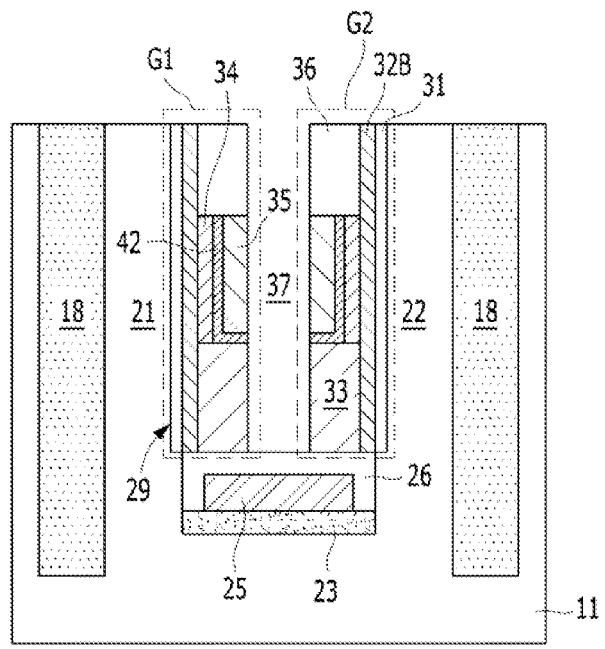

As shown in FIG. 9C, by etching the center portion of the preliminary gate electrode 10G using a second cutting mask 36, a pair of first and second gate electrodes G1 and G2 and a gate separation trench 37 may be formed. The second cutting mask 36 may cover the side surfaces of the gate trench 29 on the preliminary gate electrode 10G. For example, after forming a mask material on the entire surface including the preliminary gate electrode 10G, by etching back the mask material, the second cutting mask 36 may be formed. The second cutting mask 36 may be formed of a material which has etch selectivity to the preliminary gate electrode 10G.

Figure 9D:
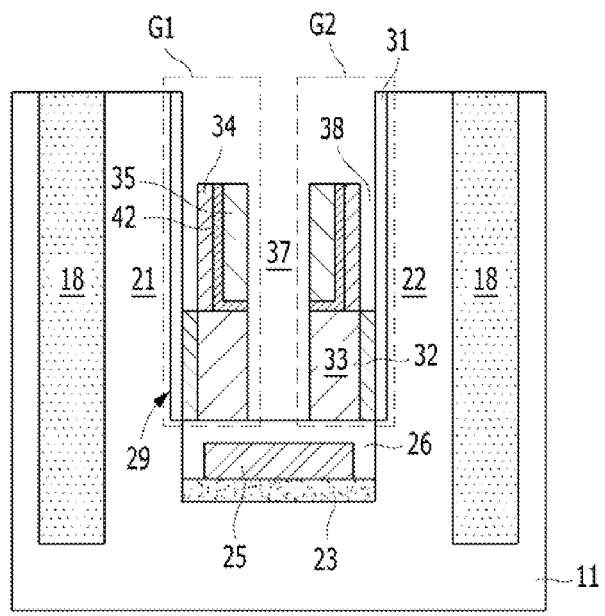

As shown in FIG. 9D, the preliminary first work function liners 32B are recessed. As a result, gaps 38 may be formed. First work function liners 32 are recessed and may remain under the gaps 38. The first work function liners 32 and the second work function liners 34 may not contact each other. That is, the first work function liners 32 and the second work function liners 34 may not overlap with each other. The gaps 38 may be positioned between the second work function liners 34 and the gate dielectric layer 31. The second cutting mask 36 may be removed.

According to the above descriptions, the first and second gate electrodes G1 and G2 may be symmetrical to each other to the gate separation trench 37. A bit line capping layer 26 may be exposed under the gate separation trench 37. The first and second gate electrodes G1 and G2 may include main parts which are positioned between the first pillar 21 and the second pillar 22, and first branch parts and second branch parts which are positioned on the side surfaces of the first pillar 21 and the second pillar 22. By the main parts, the first branch parts and the second branch parts, side surfaces of the first and second pillars 21 and 22 may overlap with the first and second gate electrodes G1 and G2. The fourth side surfaces of the first and second pillars 21 and 22 may not overlap with the first and second gate electrodes G1 and G2.

Figure 9E:
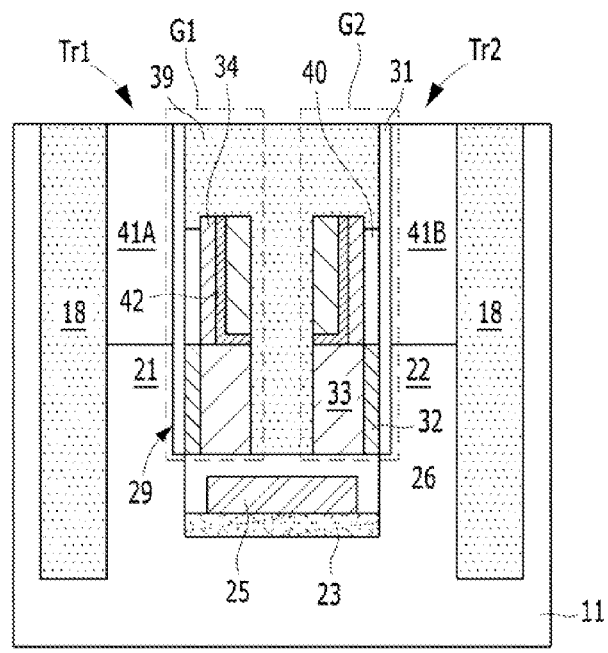

As shown in FIG. 9E, a gate capping layer 39 is formed to fill the gate separation trench 37. Since the gaps 38 are narrow, they are not filled with the gate capping layer 39 and remain as empty spaces. Accordingly, air gaps 40 may be formed between the second work function liners 34 and the gate dielectric layer 31.

The gate capping layer 39 includes a dielectric material. The gate separation trench 37 is filled with the gate capping layer 39. The gate capping layer 39 may include silicon nitride. Subsequently, planarization of the gate capping layer 39 may be performed such that the top surfaces of the first and second pillars 21 and 22 are exposed.

After forming the gate capping layer 39, an impurity doping process is performed by implantation or another doping technology. As a result, second junction regions 41A and 41B are formed in the first and second pillars 21 and 22. When performing the impurity doping process, the gate capping layer 39 is used as a barrier. The second junction regions 41A and 41B may become a source region and a drain region, respectively. Vertical channel regions may be defined between the first junction region 23 and the second junction regions 41A and 41B, respectively.

In the above descriptions, the first gate electrode G1, the first junction region 23 and the second junction region 41A may form a first transistor Tr1. The second gate electrode G2, the first junction region 23 and the second junction region 41B may form a second transistor Tr2. The first junction region 23 may become a sharing junction region. For example, the first junction region 23 serves as the source/drain regions of the first transistor Tr1 and the second transistor Tr2.

The second junction regions 41A and 41B may have a depth that overlaps with the second work function liners 34. Accordingly, the air gaps 40 and the gate dielectric layer 31 may be positioned between the second work function liners 34 and the second junction regions 41A and 41B. The air gaps 40 and the second work function liners 34 may overlap with the second junction regions 41A and 41B.

While not shown, memory elements may be electrically coupled with the second junction regions 41A and 41B in the similar manner as shown in FIG. 1.

FIGS. 10A to 10H are cross-sectional views describing an example of a method for forming the gate electrode of the semiconductor device in accordance with the third embodiment.

Figure 10A:
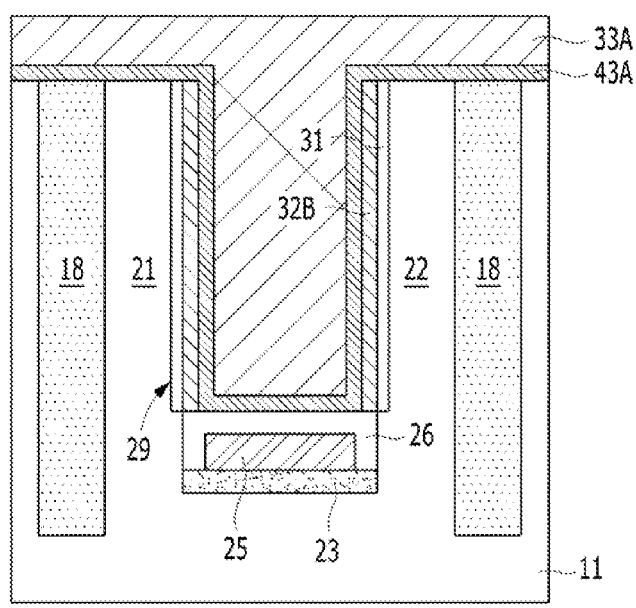
FIGS. 10A to 10H are cross-sectional views describing an example of a method for forming the gate electrode of the semiconductor device in accordance with the third embodiment.

As shown in FIG. 10A, a lower barrier layer 43A may be formed on preliminary first work function liners 32B. The lower barrier layer 43A may be conformally formed. The lower barrier layer 43A may be formed of a metal-containing material. The lower barrier layer 43A may include a metal nitride. For example, the lower barrier layer 43A may include titanium nitride.

A first low resistivity layer 33A may be formed on the lower barrier layer 43A. The first low resistivity layer 33A may fill a gate trench 29. The first low resistivity layer 33A includes a low resistivity metal material. The first low resistivity layer 33A may be formed of a reactive material to a second work function liner layer which will be subsequently formed. The first low resistivity layer 33A may be formed of tungsten. The first low resistivity layer 33A may be formed by chemical vapor deposition (CVD) or atomic layer deposition (ALD).

Figure 10B:
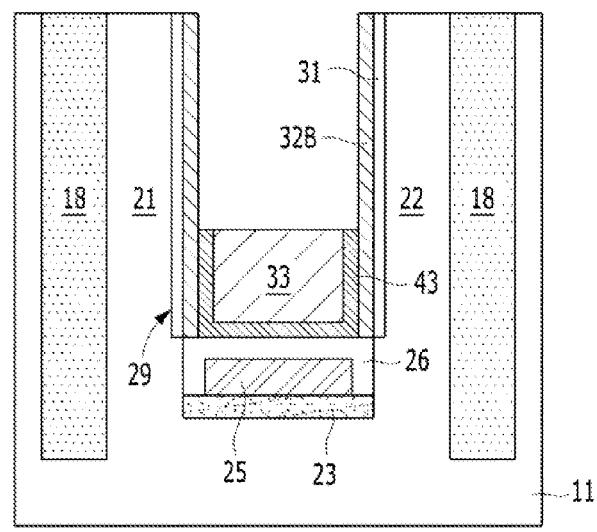

As shown in FIG. 10B, a recessing process is performed in such a manner that a lower barrier 43 and a first low resistivity electrode 33 remain in the gate trench 29. The recessing process may be performed by dry etching, for example, an etch-back process. The first low resistivity electrode 33 is formed by the etch-back process for the first low resistivity layer 33A. The lower barrier 43 is formed by the etch-back process for the lower barrier layer 43A. In another embodiment, the recessing process may be performed in such a manner that a planarization process and an etch-back process are sequentially performed.

The first low resistivity electrode 33 and the lower barrier 43 may be recessed to be lower than the top surfaces of first and second pillars 21 and 22.

Figure 10C:
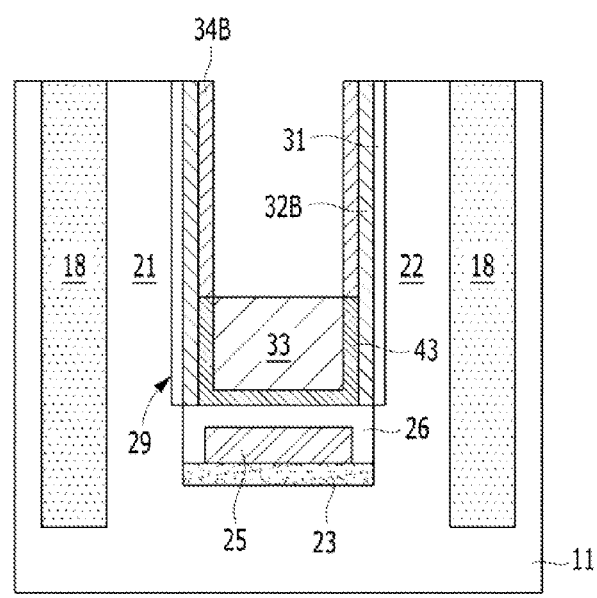

As shown in FIG. 10C, preliminary second work function liners 34B may be formed. For example, after forming a second work function liner layer (not shown) on the entire surface including the first low resistivity electrode 33, the second work function liner layer may be etched by an etch-back process. As a result, the preliminary second work function liners 34B may be formed on the sidewalls of the preliminary first work function liners 32B and on the first low resistivity electrode 33.

The preliminary second work function liners 34B may be a work function material different from the preliminary first work function liners 32B. The preliminary second work function liners 34B include a low work function material. The preliminary second work function liners 34B may be formed of a non-metal material. The preliminary second work function liners 34B may include polysilicon doped with an N-type impurity.

The preliminary second work function liners 34B and the preliminary first work function liners 32B may contact each other. The preliminary second work function liners 34B and the preliminary first work function liners 32B may be formed to the same thickness. The preliminary second work function liners 34B and the preliminary first work function liners 32B may not overlap with each other.

Figure 10D:
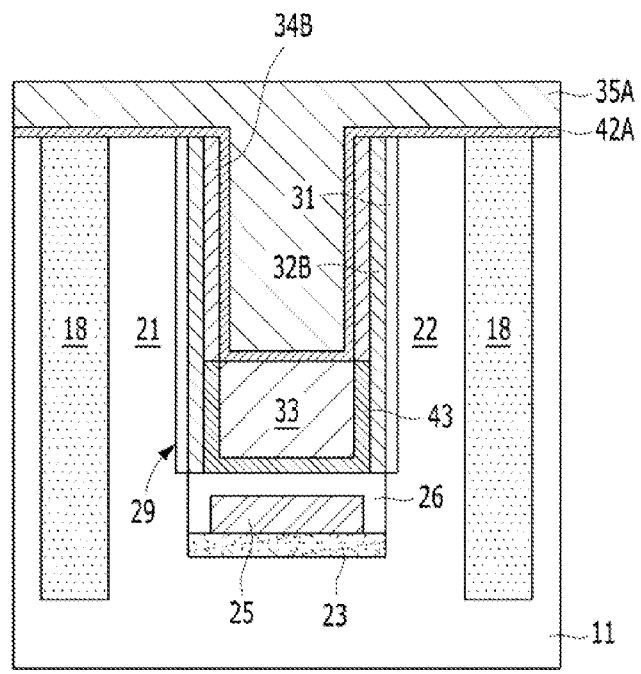

As shown in FIG. 10D, an upper barrier layer 42A may be formed on the preliminary second work function liners 34B. A second low resistivity layer 35A may be formed on the upper barrier layer 42A. The second low resistivity layer 35A may fill the remaining portion of the gate trench 29. The second low resistivity layer 35A may be formed of the same material as the first low resistivity electrode 33. The second low resistivity layer 35A includes a low resistivity metal material. The second low resistivity layer 35A may be formed of a reactive material to the preliminary second work function liners 34B. The second low resistivity layer 35A may be formed of titanium nitride. The second low resistivity layer 35A may be formed by chemical vapor deposition (CVD) or atomic layer deposition (ALD). The upper barrier layer 42A may be conformally formed. The upper barrier layer 42A may be formed of a metal-containing material. The upper barrier layer 42A may include a metal nitride. For example, the upper barrier layer 42A may include titanium nitride.

Figure 10E:
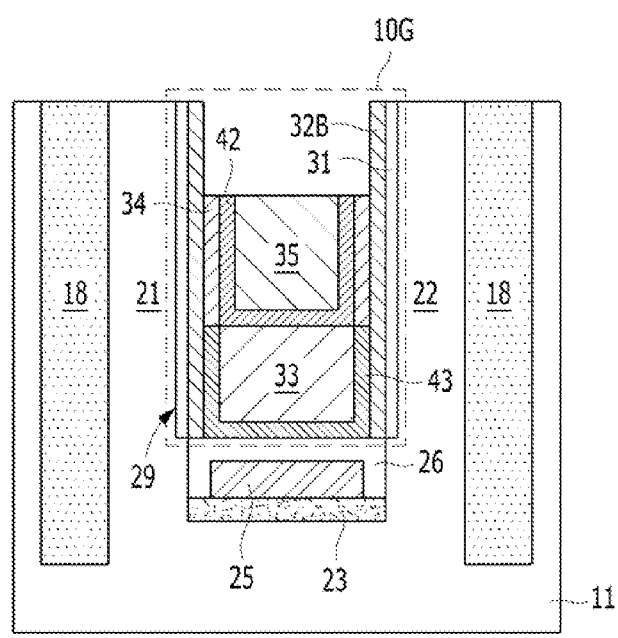

As shown in FIG. 10E, a recessing process is performed in such a manner that an upper barrier 42, a second low resistivity electrode 35 and second work function liners 34 remain in the gate trench 29. The recessing process may be performed by dry etching, for example, an etch-back process. The second low resistivity electrode 35 is formed by the etch-back process for the second low resistivity layer 35A. The upper barrier 42 is formed by the etch-back process for the upper barrier layer 42A. The second work function liners 34 are formed by the etch-back process for the preliminary second work function liners 34B. In another embodiment, the recessing process may be performed in such a manner that a planarization process and an etch-back process are sequentially performed.

Upon completion of the recessing process, a preliminary gate electrode 10G may be formed.

The top surface of the preliminary gate electrode 10G is positioned to be lower than the top surfaces of first and second pillars 21 and 22. The physical distance between the second low resistivity electrode 35 and a surrounding conductor for example, a contact plug, may be sufficiently secured.

Figure 10F:
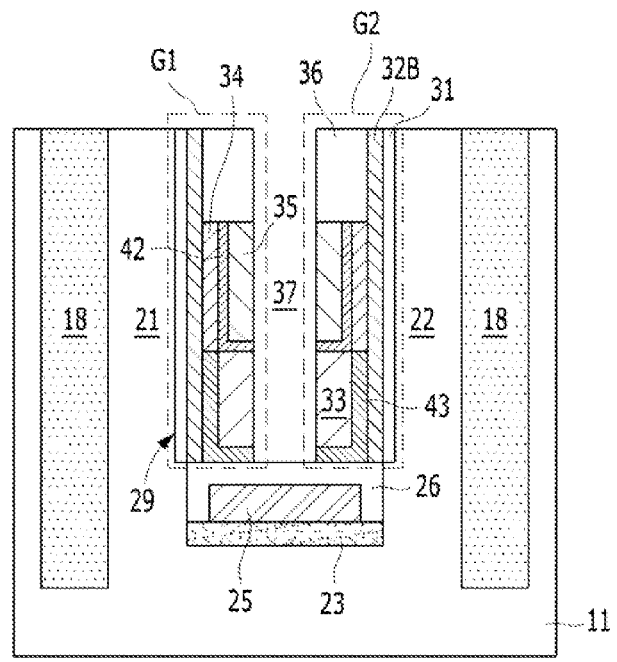

As shown in FIG. 10F by etching the center portion of the preliminary gate electrode 10G using a second cutting mask 36, a pair of first and second gate electrodes G1 and G2 and a gate separation trench 37 may be formed. The second cutting mask 36 may cover the side surfaces of the gate trench 29 on the preliminary gate electrode 10G. For example, after forming a mask material on the entire surface including the preliminary gate electrode 10G, by etching back the mask material, the second cutting mask 36 may be formed. The second cutting mask 36 may be formed of a material which has etch selectivity to the preliminary gate electrode 10G.

Figure 10G:
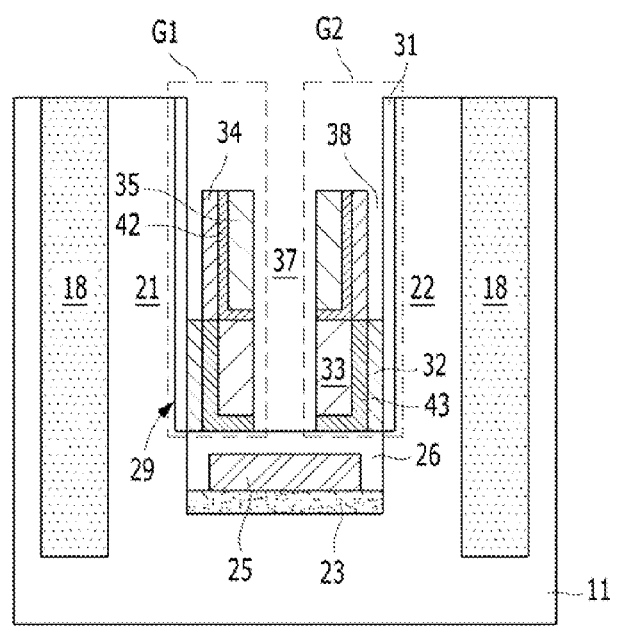

As shown in FIG. 10G, the preliminary first work function liners 32B are recessed. As a result, gaps 38 may be formed. First work function liners 32 are gapped and remain under the gaps 38. The first work function liners 32 and the second work function liners 34 may not contact each other. That is, the first work function liners 32 and the second work function liners 34 may not overlap with each other. The gaps 38 may be positioned between the second work function liners 34 and the gate dielectric layer 31. The second cutting mask 36 may be removed.

According to the above descriptions, the first and second gate electrodes G1 and G2 may be symmetrical to each other to the gate separation trench 37. A bit line capping layer 26 may be exposed under the gate separation trench 37. The first and second gate electrodes G1 and G2 may include main parts which are positioned between the first pillar 21 and the second pillar 22, and first branch parts and second branch parts which are positioned on the side surfaces of the first pillar 21 and the second pillar 22. By the main parts, the first branch parts and the second branch parts, side surfaces of the first and second pillars 21 and 22 may overlap with the first and second gate electrodes G1 and G2. The fourth side surfaces of the first and second pillars 21 and 22 may not overlap with the first and second gate electrodes G1 and G2.

Figure 10H:
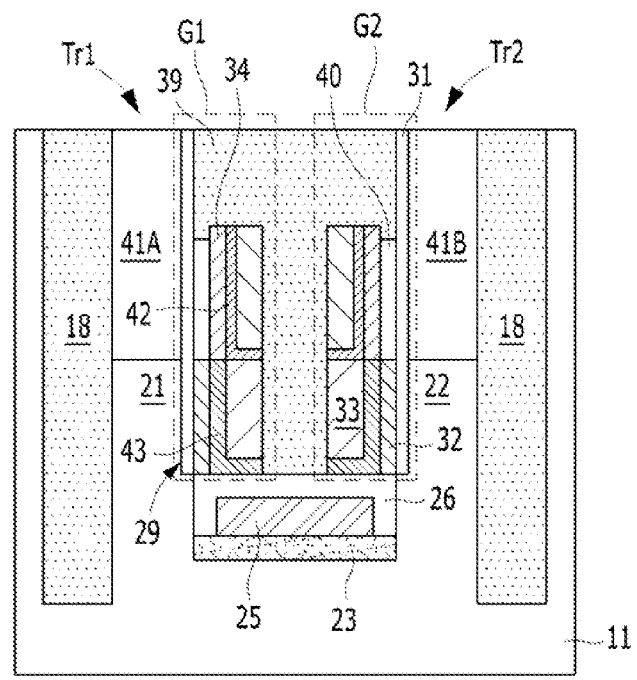

As shown in FIG. 10H, a gate capping layer 39 is formed to fill the gate separation trench 37. Since the gaps 38 are narrow, they are not filled with the gate capping layer 39 and remain as empty spaces to form air gaps 40. Accordingly, the air gaps 40 may be positioned between the second work function liners 34 and the gate dielectric layer 31.

The gate capping layer 39 includes a dielectric material. The gate separation trench 37 is filled with the gate capping layer 39. The gate capping layer 39 may include silicon nitride. Subsequently, planarization of the gate capping layer 39 may be performed such that the top surfaces of the first and second pillars 21 and 22 are exposed.

After forming the gate capping layer 39, an impurity doping process is performed by implantation or another doping technology. As a result, second junction regions 41A and 41B are formed in the first and second pillars 21 and 22. When performing the impurity doping process, the gate capping layer 39 is used as a barrier. The second junction regions 41A and 41B may become a source region and a drain region. Vertical channel regions may be defined between the first junction region 23 and the second junction regions 41A and 41B.

In the above descriptions, the first gate electrode G1, the first junction region 23 and the second junction region 41A may form a first transistor Tr1. The second gate electrode G2, the first junction region 23 and the second junction region 41B may form a second transistor Tr2. The first junction region 23 may become a sharing junction region. For example, the first junction region 23 serves as the source/drain regions of the first transistor Tr1 and the second transistor Tr2.

The second junction regions 41A and 41B may have a depth that overlaps with the second work function liners 34. Accordingly, the air gaps 40 and the gate dielectric layer 31 may be positioned between the second work function liners 34 and the second junction regions 41A and 41B. The air gaps 40 and the second work function liners 34 may overlap with the second junction regions 41A and 41B.

While not shown, memory elements may be electrically coupled with the second junction regions 41A and 41B.

The semiconductor device according to the embodiments may be embedded in an electronic device. The electronic device may include a memory and a non-memory. The memory includes an SRAM, a DRAM, a FLASH, an MRAM, a ReRAM, an STTRAM and an FeRAM. The non-memory includes a logic circuit. The logic circuit may include a sense amplifier, a decoder, an input/output circuit, etc. for controlling a memory device. Also, the logic circuit may include various integrated circuits (ICs) in addition to a memory. For example, the logic circuit includes a microprocessor, an application processor of a mobile device, etc. Moreover, the non-memory includes a logic gate such as a NAND gate, a driver IC for a display device, a power semiconductor device such as a power management IC (PMIC), etc. The electronic device may include a computing system, an image sensor, a camera, a mobile device, a display device, a sensor, a medical instrument, an optoelectronic device, an RFID (radio frequency identification), a solar cell, a semiconductor device for a vehicle, a semiconductor device for a railroad car, a semiconductor device for an aircraft, etc.

Figure 11:
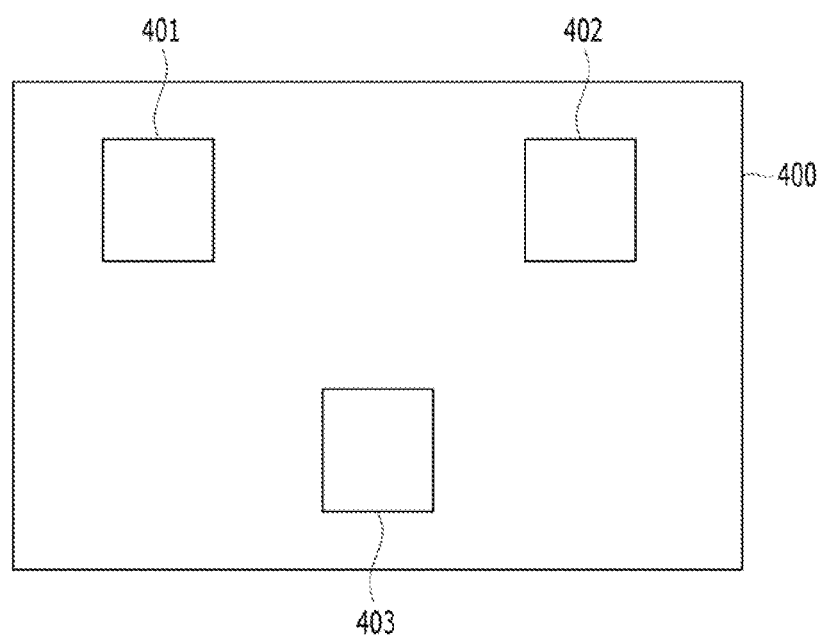
FIG. 11 is a diagram illustrating an electronic device including the semiconductor device in accordance with the embodiments.

FIG. 11 is a diagram illustrating an electronic device including the semiconductor device in accordance with the embodiments.

Referring to FIG. 11, an electronic device 400 may include a plurality of semiconductor devices 401, 402 and 403. For example, the plurality of semiconductor devices 401, 402 and 403 may include a semiconductor device according to an embodiment. For example, the plurality of semiconductor devices 401, 402 and 403 may include the semiconductor device 100, 200 or 300 described above.

At least one semiconductor device among the semiconductor devices 401, 402 and 403 included in the electronic device 400 may include a body including a first junction region, pillars positioned on the body and including vertical channel regions and second junction regions on the vertical channel regions, a gate trench exposing the side surfaces of the pillars, a gate dielectric layer covering the gate trench, and gate electrodes embedded in the gate trench with the gate dielectric layer interposed therebetween. Each gate electrode may include a first work function liner overlapping with each vertical channel region and including titanium aluminum nitride, a second work function liner overlapping with each second junction region and including an N-type doped polysilicon, and an air gap positioned between the second work function liner and the second junction region. A low work function liner and the air gap overlap with the second junction region. Accordingly, gate-induced drain leakage (GIRL) may be reduced. A high work function liner ray overlap with the vertical channel region. Accordingly, the electronic device 400 may realize a high operation speed in correspondence to scale-down.

As is apparent from the above descriptions, according to the embodiments, since a low work function liner including an N-type doped polysilicon and an air gap are formed between a gate electrode and a junction region, gate-induced drain leakage may be reduced.

Also, according to the embodiments, since a high work function liner overlapping with a vertical channel region and including titanium aluminum nitride is formed, channel dose may be decreased and thus junction leakage may be reduced.

Although various embodiments have been described for illustrative purposes, it will be apparent to those skilled in the art that various changes and modifications may be made without departing from the spirit and scope of the invention as defined in the following.

What is claimed:

1. A semiconductor device comprising:
a body including a first junction region;
a pillar positioned over the body and including a vertical channel region and a second junction region over the vertical channel region;
a gate trench exposing side surfaces of the pillar;
a gate dielectric layer provided in the gate trench and over a side surface of the pillar; and
a gate electrode provided in the gate trench, wherein the gate dielectric layer is interposed between the gate electrode and the gate trench,
wherein the gate electrode comprising:
a first work function liner over the vertical channel region and including an aluminum-containing metal nitride;
a second work function liner over the second junction region and including a silicon-containing non-metal material; and
an air gap positioned between the second work function liner and the second junction region.

2. The semiconductor device according to claim further comprising:
a bit line trench formed in the body;
a bit line provided in the bit line trench and electrically coupled to the first junction region;
a bit line capping layer covering a top surface and side surfaces of the bit line; and
a memory element electrically coupled to the second junction region.

3. The semiconductor device according to claim 1, wherein the first work function liner includes a material which has a work function higher than the second work function liner.

4. The semiconductor device according to claim 1, wherein the first work function liner includes titanium aluminum nitride (TiAlN) and
wherein the second work function liner includes an N-type purity-doped polysilicon.

5. The semiconductor device according to claim herein the gate electrode further comprises:
a first low resistivity electrode provided over the first work function liner; and
a second low resistivity electrode over the second work function liner.

6. The semiconductor device according to claim 5, wherein the second low resistivity electrode includes a material which is non-reactive with the second work function liner.

7. The semiconductor device according to claim 5, wherein the first low resistivity electrode includes a fluorine-free material which is non-reactive with the second work function liner.

8. The semiconductor device according to claim 1, wherein the gate electrode comprises:
a main part; and
a pair of first and second branch parts from the main part,
wherein the main part extends in a first direction,
wherein each of the pair of first and second branch parts extends in a second direction different from the first direction, and
wherein the main part, the first branch part, and the second branch part are formed over first, second, and third side surface of the pillar, respectively.

9. The semiconductor device according to claim 1, wherein the gate electrode further comprises:
a first low resistivity electrode covering a side surface of the first work function liner;
a second low resistivity electrode covering a side surface of the second work function liner; and
an upper barrier positioned between the second work function liner and the second low resistivity electrode.

10. The semiconductor device according to claim 9, wherein the first low resistivity electrode includes a material which is non-reactive with the second work function liner, and wherein the second low resistivity electrode includes a material which is reactive with the second work function liner.

11. The semiconductor device according to claim 1, wherein the gate electrode further comprises:
   a first low resistivity electrode covering a side surface of the first work function liner;
   a lower barrier positioned between the first work function liner and the first low resistivity electrode;
   a second low resistivity electrode covering a side surface of the second work function liner; and
   an upper barrier positioned between the second work function liner and the second low resistivity electrode.

12. The semiconductor device according to claim 11, wherein the first low resistivity electrode and the second low resistivity electrode include materials which are reactive with the second word function liner.

13. A semiconductor device comprising:
   a body including a first junction region;
   a bit line trench formed in the body;
   a bit line provided in the bit line trench and electrically coupled to the first junction region;
   a bit line capping layer provided over a top surface and over side surfaces of the bit line;
   a pair of first and second pillars positioned over the body and including vertical channel regions and second junction regions over the vertical channel regions;
   a gate trench having main trench which exposes a space between the first pillar and the second pillar, and branch trenches which expose side surfaces of the first and second pillars;
   a pair of first and second gate electrodes provided over the side surfaces of the first and second pillars exposed by the branch trenches, respectively; and
   memory elements electrically coupled with the second junction regions, respectively,
   wherein each of the first and second gate electrodes comprising:
      a first work function liner over a side surface of the vertical channel region and including an aluminum-containing metal nitride;
      a second work function liner over a side surface of the second junction region and including a silicon-containing non-metal material; and
      an air gap positioned between the second work function liner and the second junction region.

14. The semiconductor device according to claim 13, wherein each of the first and second gate electrodes comprises:
   a main part positioned between the first pillar and the second pillar; and
   a pair of first and second branch parts extending from the main part,
   wherein the main part extends in a first direction,
   wherein each of the pair of first and second branch parts extends in a second direction different from the first direction,
   wherein the main part, the first branch part, and the second branch part are formed over the side surfaces of each of the first and second pillars.

15. The semiconductor device according to claim 14, wherein the side surfaces comprises:
   a first side surface over the main part;
   a second side surface over the first branch part; and
   a third side surface over the second branch part.

16. The semiconductor device according to claim 15, each of the first and second pillars further comprising:
   a fourth side surface; and
   an isolation layer contacting the fourth side surface.

17. The semiconductor device according to claim 13, wherein the first work function liner includes titanium aluminum nitride (TiAlN), and
   wherein the second work function liner includes an N-type impurity-doped polysilicon.

18. The semiconductor device according to claim 13, wherein each of the first and second gate electrodes further comprises:
   a first low resistivity electrode over the first work function liner; and
   a second low resistivity electrode over the second work function liner.

19. The semiconductor device according to claim 13, wherein each of the first and second gate electrodes further comprises:
   a first low resistivity electrode over the first work function liner;
   a second low resistivity electrode over the second work function liner; and
   an upper barrier positioned between the second work function liner and the second low resistivity electrode.

20. The semiconductor device according to claim 13, wherein each of the first and second gate electrodes further comprises:
   a first low resistivity electrode over the first work function liner;
   a lower barrier positioned between the first work function liner and the first low resistivity electrode;
   a second low resistivity electrode over the second work function liner; and
   an upper barrier positioned between the second work function liner and the second low resistivity electrode.

* * * * *